(12) United States Patent
Mabuchi

(10) Patent No.: US 8,399,914 B2
(45) Date of Patent: Mar. 19, 2013

(54) METHOD FOR MAKING SOLID-STATE IMAGING DEVICE

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 338 days.

(21) Appl. No.: 12/854,597

(22) Filed: Aug. 11, 2010

(65) Prior Publication Data

US 2011/0042723 A1 Feb. 24, 2011

(30) Foreign Application Priority Data

Aug. 20, 2009 (JP) ................................. 2009-191133

(51) Int. Cl.
*H01L 31/08* (2006.01)

(52) U.S. Cl. ............................ 257/225; 257/222; 438/60

(58) Field of Classification Search ................... 257/79, 257/222, 225, 291–294, 431, E21.568, E21.703, 257/E27.112, E27.132, E27.133, E31.052, 257/E31.097; 438/28, 29, 57, 60, 69, 75; 348/308, 311

See application file for complete search history.

(56) References Cited

U.S. PATENT DOCUMENTS

| | | | | |
|---|---|---|---|---|
| 5,466,612 | A | * | 11/1995 | Fuse et al. ........................ 438/60 |
| 7,622,321 | B2 | * | 11/2009 | Rhodes ............................ 438/60 |
| 2005/0116259 | A1 | * | 6/2005 | Komori .......................... 257/222 |

FOREIGN PATENT DOCUMENTS

JP 2006-173351 6/2006

OTHER PUBLICATIONS

Xinyu Zheng et al.; Process and Pixels for High Performances Imager in SOI-CMOS Technology; IEEE CCD AIS Workshop; 2003; Schloss-Elmau, Germany, May 15-17.

* cited by examiner

*Primary Examiner* — Howard Weiss
*Assistant Examiner* — Sue Tang
(74) *Attorney, Agent, or Firm* — SNR Denton US LLP

(57) ABSTRACT

A solid-state imaging device includes a photoelectric conversion unit that includes a first region of a first conductivity type and a second region of a second conductivity type between which a pn junction is formed, the first region and the second region being formed in a signal-readout surface of a semiconductor substrate, the second region being located at a position deeper than the first region; and a transfer transistor configured to transfer signal charges accumulated in the photoelectric conversion unit to a readout drain through a channel region that lies under a surface of the first region and horizontally adjacent to the photoelectric conversion unit, the transfer transistor being formed in the signal-readout surface. The transfer transistor includes a transfer gate electrode that extends from above the channel region with a gate insulating film therebetween to above the first region so as to extend across a step.

6 Claims, 19 Drawing Sheets

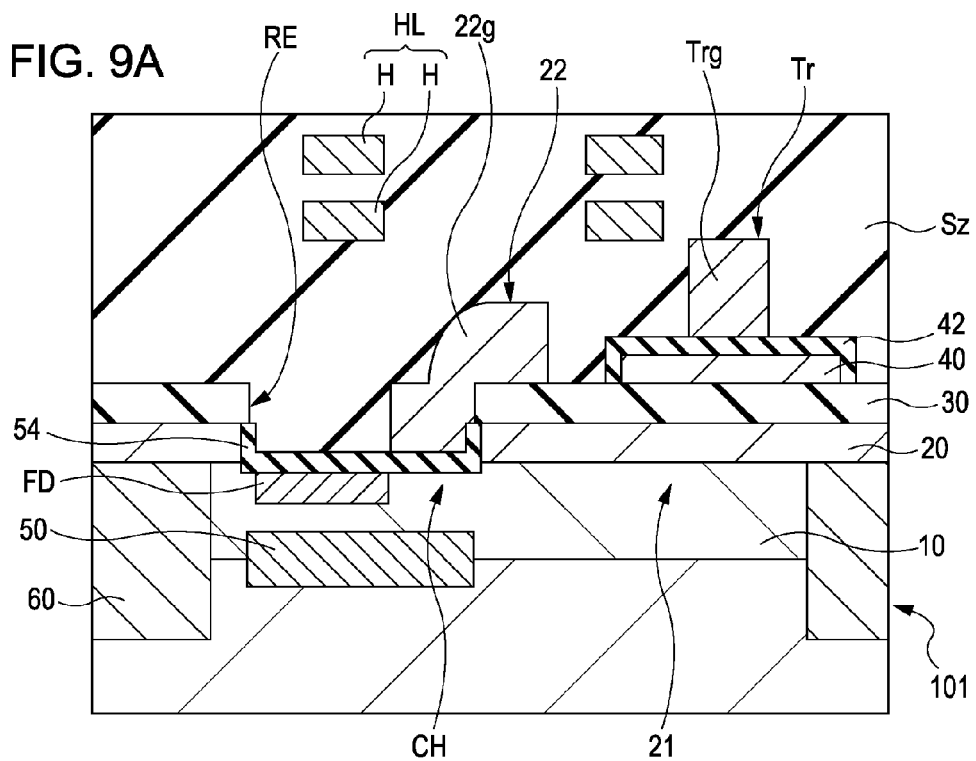
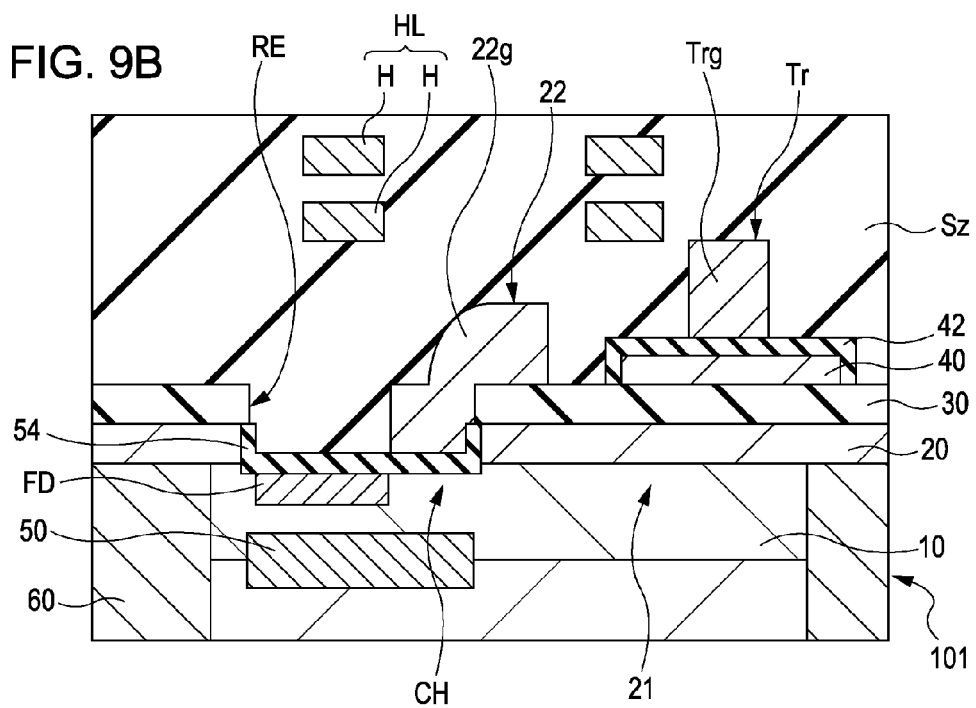

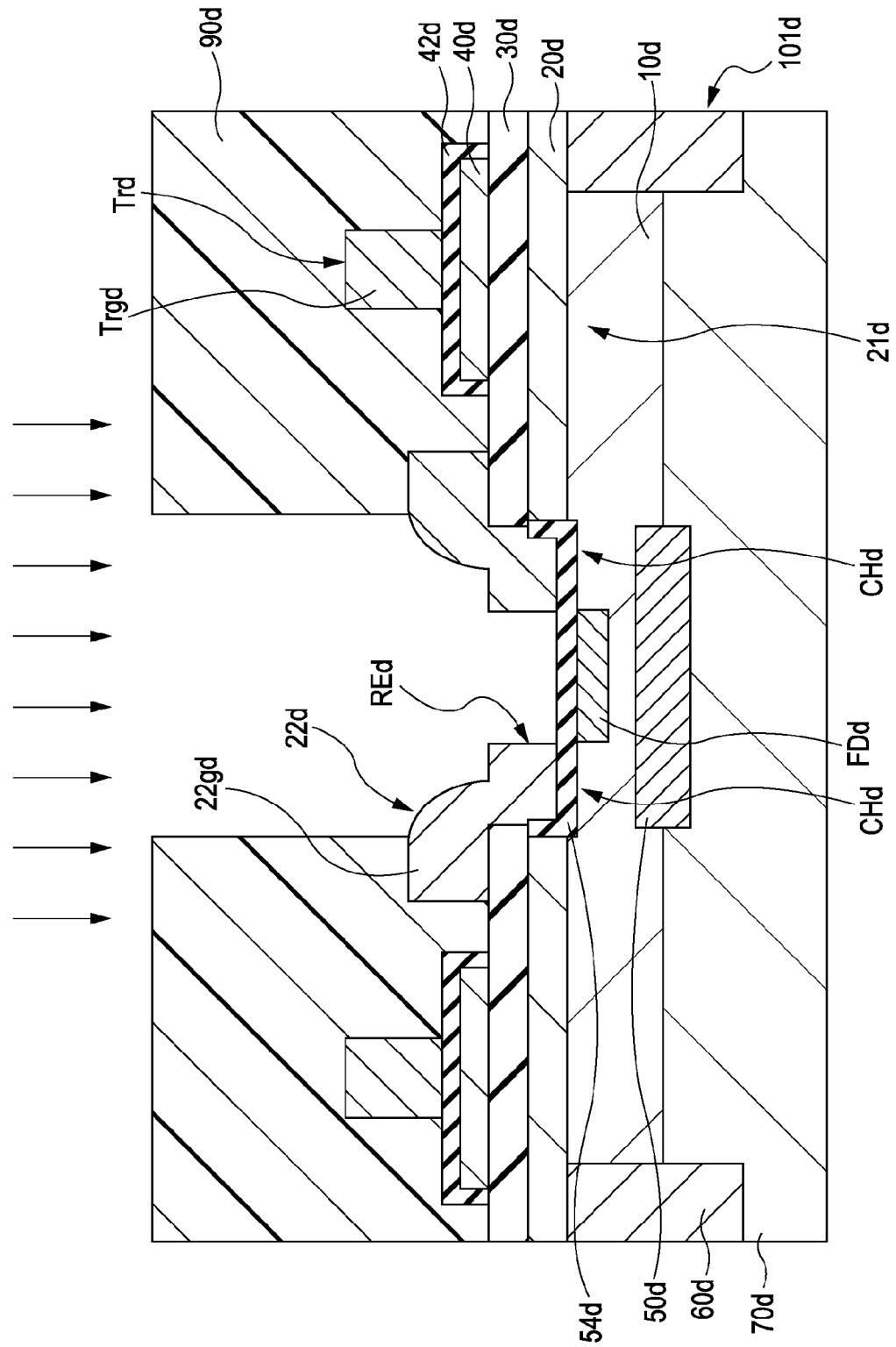

US 8,399,914 B2

METHOD FOR MAKING SOLID-STATE IMAGING DEVICE

BACKGROUND OF THE INVENTION

1. Field of the Invention

The present invention relates to a solid-state imaging device, an electronic apparatus, and a method for making a solid-state imaging device.

2. Description of the Related Art

Electronic apparatuses such as digital video cameras and digital still cameras include solid-state imaging devices. Examples of the solid-state imaging devices included in electronic apparatuses include complementary metal oxide semiconductor (CMOS)-type image sensors and charge coupled device (CCD)-type image sensors.

A solid-state imaging device has an imaging region on a surface of a semiconductor substrate. The imaging region is where a plurality of pixels are formed. A plurality of photoelectric conversion elements corresponding to the pixels are also formed in the imaging region. Photoelectric conversion elements receive light from an object to be captured and convert the light into electric charges to generate signal charges. For example, photodiodes are formed as such photoelectric conversion elements. Each photodiode generates signal charges by converting the received light into electric charges at its pn junction and accumulates the signal charges.

One example of solid-state imaging devices is a CMOS image sensor. A type of CMOS image sensor has been conceived in which a transfer transistor is formed on a silicon-on-insulator (SOI) substrate in a portion where silicon oxide is removed and a pixel transistor is formed on the top silicon layer of the SOI substrate. With regard to this CMOS image sensor, extending a photodiode to reach a portion under the pixel transistor has been proposed. This is because when this structure is employed in a solid-state imaging device that uses a buried-type photodiode capable of improving characteristics such as reducing dark current, white spots, residual images, and the like, the size of the solid-state imaging device can be reduced and the saturation electron number of the solid-state imaging device can be increased (e.g., refer to Japanese Unexamined Patent Application Publication No. 2006-173351 and Xinyu Zheng, Suresh Seahadri, Michael Wood, Chris Wrigley, and Bedabrate Pain, "Process and Pixels for High Performance Imager in SOI-CMOS Technology" (Germany), IEEE workshop on charge-coupled Device & Advanced Image Sensors, May 2003).

SUMMARY OF THE INVENTION

In order to form a photodiode that continuously extends from a portion of the SOI substrate where a buried oxide (BOX) layer remains to a portion where the BOX layer has been removed, ion implantation is desirably conducted before the removal of the BOX layer. This means that a transfer gate electrode is formed after ion implantation for forming the photodiode. However, this may cause a large amount of misalignment between the transfer gate electrode and the photodiode.

When the photodiode does not extend under pixel transistors other than the transfer transistors, the transfer gate electrode can be formed first and then ions can be implanted in a self-aligning manner using the transfer electrode as a mask. This can eliminate misalignment between the photodiode and the pixel transistors other than the transfer transistor.

However, it is difficult to employ this process to form a photodiode that extends under a pixel transistor other than the transfer transistor. Thus, misalignment between the transfer transistor and the photodiode may still occur. As a result, the efficiency of transferring signal charges from the photodiode to a floating diffusion may decrease and the quality of images captured may degrade.

It is desirable to provide a solid-state imaging device and an electronic apparatus that can improve the image quality of captured images and a method for making the solid-state imaging device.

An embodiment of the present invention provides a method for making a solid-state imaging device including a semiconductor substrate having a signal-readout surface in which a photoelectric conversion unit and a transfer transistor are formed, the photoelectric conversion unit including a first region and a second region that form a pn junction therebetween, the transfer transistor being configured to transfer signal charges from the photoelectric conversion unit to a readout drain via a channel region. The method includes the steps of forming the first region in the semiconductor substrate by implanting ions of an impurity of a first conductivity type into a portion of the signal-readout surface where the photoelectric conversion unit, the channel region, and the readout drain are to be formed; forming the second region in the semiconductor substrate by implanting an impurity of a second conductivity type into a portion of the signal-readout surface where the photoelectric conversion unit, the channel region, and the readout drain are to be formed, the portion being located at a position deeper than the first region; forming a resist pattern over the signal-readout surface, the resist pattern having an opening that leaves a portion of the signal-readout surface uncovered where the channel region and the readout drain are to be formed; forming a third region in the semiconductor substrate by implanting an impurity of the first conductivity type into a portion of the signal-readout surface where the channel region and the readout drain are to be formed, the portion being located at a position deeper than the first region, while using the resist pattern as a mask; removing a portion of the first region that lies above the third region by etching;

forming a gate insulating film of the transfer transistor on a portion of the signal-readout surface of the semiconductor substrate from which the first region has been removed; forming a transfer gate electrode that extends from above the channel region with the gate insulating film therebetween to above the first region; and forming the readout drain by implanting ions of an impurity of the second conductivity type into a portion of the signal-readout surface of the semiconductor substrate from which the first region has been removed, while using the transfer gate electrode as a mask.

In this embodiment, the same mask is used to form the third region and remove the first region. Thus, the third region can be formed in a self-aligning manner. Then a transfer gate electrode is formed to extend from above the channel-forming region in the portion from which the first region is removed to above the photoelectric conversion unit. The transfer gate electrode is used as a mask to form a readout drain in a self-aligning manner. Thus, misalignment between the transfer gate electrode and the photoelectric conversion unit and between the transfer gate electrode and the readout drain does not occur. As a result, the decrease in efficiency of transferring signal charges caused by misalignment can be suppressed.

Another embodiment of the present invention provides a solid-state imaging device that includes a photoelectric conversion unit that includes a first region of a first conductivity type and a second region of a second conductivity type between which a pn junction is formed, the first region and the second region being formed in a signal-readout surface of a semiconductor substrate, the second region being located at a position deeper than the first region; and a transfer transistor configured to transfer signal charges accumulated in the photoelectric conversion unit to a readout drain through a channel region that lies under a surface of the first region and horizontally adjacent to the photoelectric conversion unit, the transfer transistor being formed in the signal-readout surface. The transfer transistor includes a transfer gate electrode that extends from above the channel region with a gate insulating film therebetween to above the first region so as to extend across a step.

According to this embodiment, the positional relationship between the transfer gate electrode and the photoelectric conversion unit is determined by the step. Thus, there is no adverse effect of misalignment, and the efficiency of transferring signal charges improves.

Yet another embodiment of the present invention provides an electronic apparatus that includes a photoelectric conversion unit that includes a first region of a first conductivity type and a second region of a second conductivity type between which a pn junction is formed, the first region and the second region being formed in a signal-readout surface of a semiconductor substrate, the second region being located at a position deeper than the first region; and a transfer transistor configured to transfer signal charges accumulated in the photoelectric conversion unit to a readout drain through a channel region that lies under a surface of the first region and horizontally adjacent to the photoelectric conversion unit, the transfer transistor being formed in the signal-readout surface. The transfer transistor includes a transfer gate electrode that extends from above the channel region with a gate insulating film therebetween to above the first region so as to extend across a step.

According to the embodiments of the present invention, a solid-state imaging device and an electronic apparatus that can improve the image quality of captured images and a method for making the solid-state imaging device can be provided.

BRIEF DESCRIPTION OF THE DRAWINGS

FIGS. 6A to 9B are cross-sectional views showing a relevant part in the respective steps of a method for making the solid-state imaging device of the first embodiment;

FIGS. 18A and 18B are cross-sectional views showing a relevant part in the respective steps of a method for making the solid-state imaging device of the fourth embodiment.

DESCRIPTION OF THE PREFERRED EMBODIMENTS

Embodiments of the present invention will now be described with reference to drawings.

The embodiments are described the following order:
1. First embodiment (a transfer gate electrode is formed on a BOX layer)
2. Second embodiment (a transfer gate electrode is formed on a substrate ($P^+$))
3. Third embodiment (a transfer gate electrode is formed on a top silicon layer)
4. Fourth embodiment (a transfer gate electrode is formed on an oxide film)

1. First Embodiment

[A] Device Configuration
(1) Overall Configuration of Camera

Figure 1:
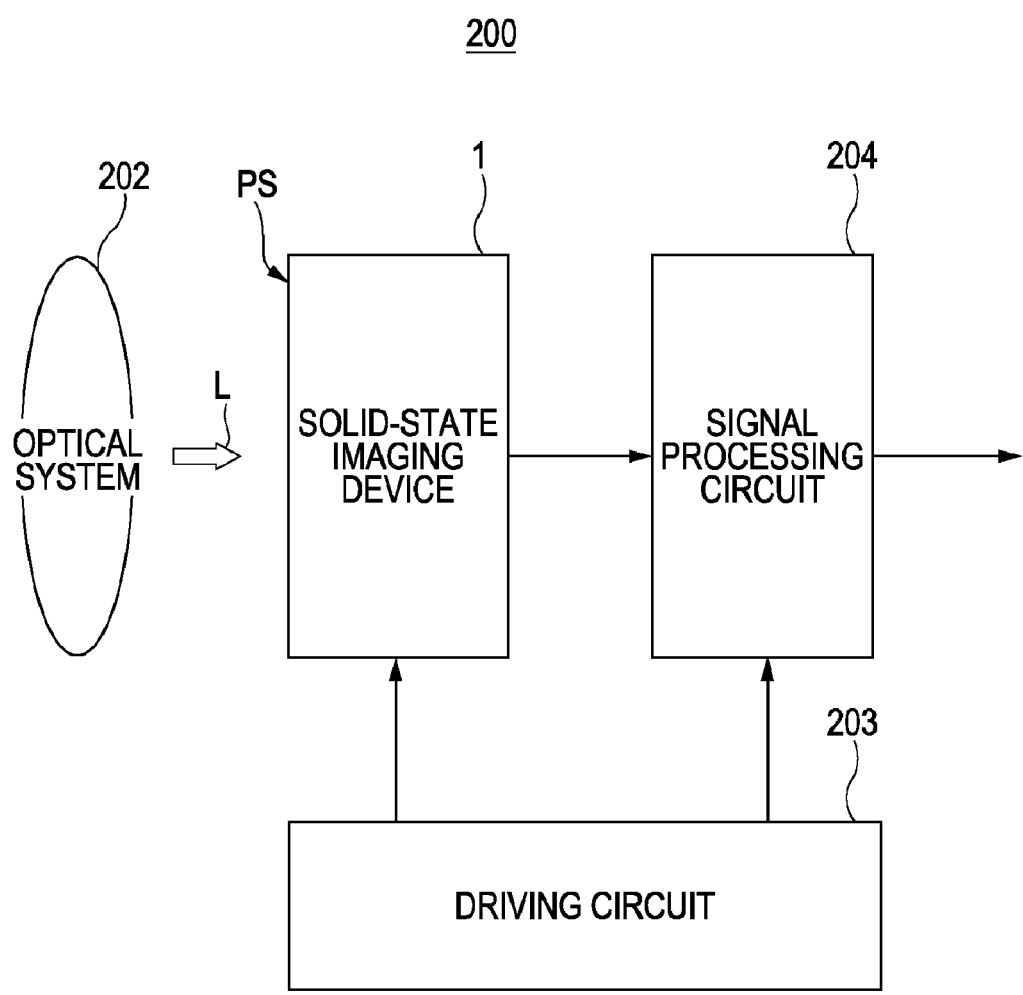
FIG. 1 is a diagram showing a configuration of a camera according to an embodiment of the present invention.

FIG. 1 is a diagram showing a configuration of a camera according to an embodiment of the present invention.

As shown in FIG. 1, a camera 200 includes a solid-state imaging device 1, an optical system 202, a driving circuit 203, and a signal processing circuit 204 which are described below.

The solid-state imaging device 1 has a surface that receives incident light (image of an object to be captured) that has entered through the optical system 202. The solid-state imaging device 1 converts the incident light into electric charges to generate signal charges and outputs raw data. The solid-state imaging device 1 is driven in accordance with control signals output from the driving circuit 203. The detailed structure of the solid-state imaging device 1 is described below.

The optical system 202 includes an imaging lens (not shown) and a diaphragm (not shown) and is arranged so that the incident light of an image of an object to be captured is condensed on a surface PS of the solid-state imaging device 1.

To be more specific, as shown in FIG. 1, the optical system 202 emits a chief ray L in a direction perpendicular to the surface PS in a central portion of the surface PS of the solid-state imaging device 1. However, the chief ray L emitted toward a peripheral portion of the surface PS is inclined with respect to the direction perpendicular to the surface PS. Since the exit pupil distance is finite in the optical system 202, the chief ray L emitted toward the surface PS of the solid-state imaging device 1 becomes increasingly inclined with increasing distance from the center of the surface PS.

The driving circuit 203 outputs various control signals to the solid-state imaging device 1 and the signal processing circuit 204 and controls the operation of the solid-state imaging device 1 and the signal processing circuit 204.

The signal processing circuit 204 is configured to generate a digital image of an object to be captured by performing signal processing on the raw data output from the solid-state imaging device 1.

(2) Overall Configuration of Solid-State Imaging Device

An overall configuration of the solid-state imaging device 1 will now be described.

Figure 2:
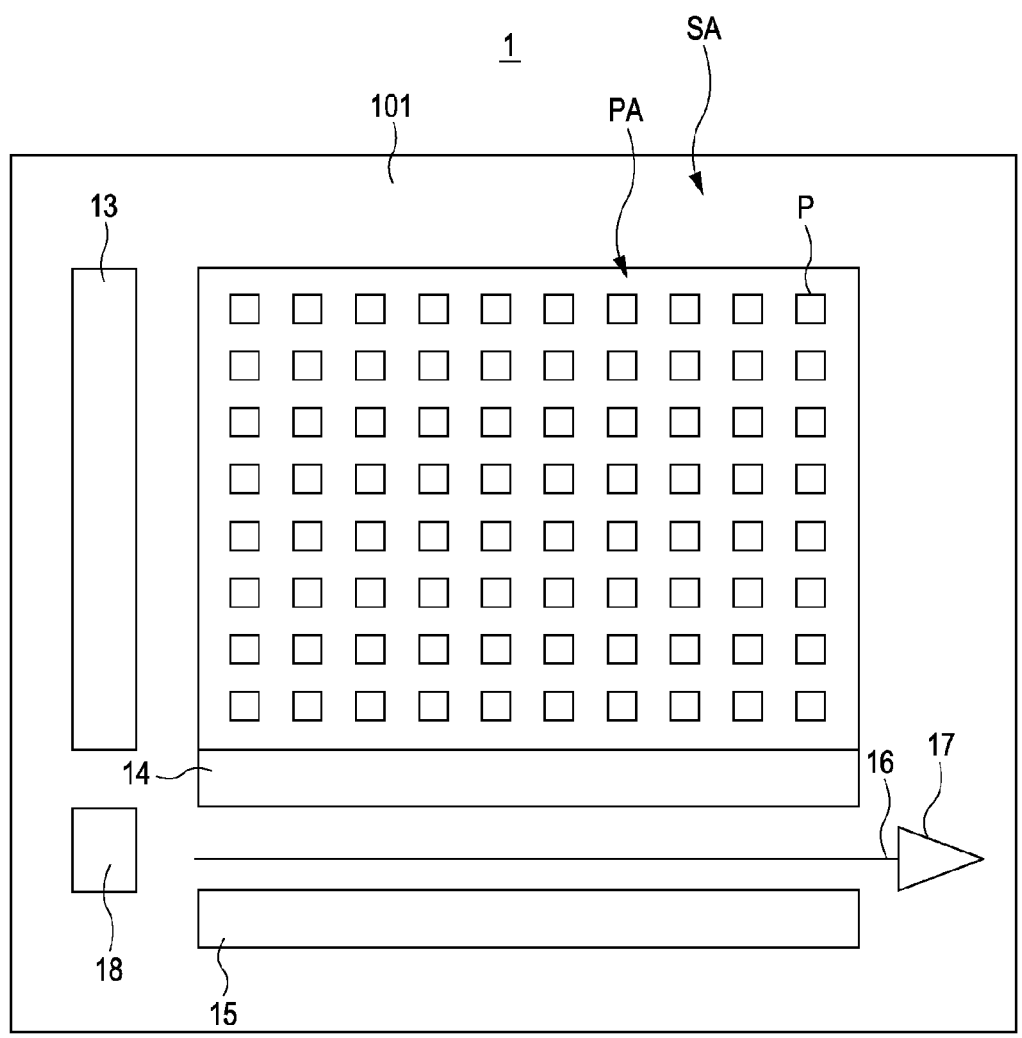
FIG. 2 is a schematic plan view of an overall configuration of a solid-state imaging device according to a first embodiment of the present invention.

FIG. 2 is a schematic plan view of an overall configuration of the solid-state imaging device according to the first embodiment of the present invention.

The solid-state imaging device 1 of this embodiment is a CMOS-type image sensor and includes a semiconductor substrate 101 as shown in FIG. 2. The semiconductor substrate 101 has an image-capturing region PA and a peripheral region SA in a surface, as shown in FIG. 2. The semiconductor substrate 101 is composed of, for example, silicon.

(2-1) Image-Capturing Region

The image-capturing region PA will now be described.

Referring to FIG. 2, the image-capturing region PA has a rectangular shape and has pixels P aligned in the x direction and the y direction. In other words, the pixels P are arranged in a matrix. The image-capturing region PA is arranged so that its center is aligned with the optical axis of the optical system 202 shown in FIG. 1. The image-capturing region PA is equivalent to the surface PS shown in FIG. 1.

Figure 3:
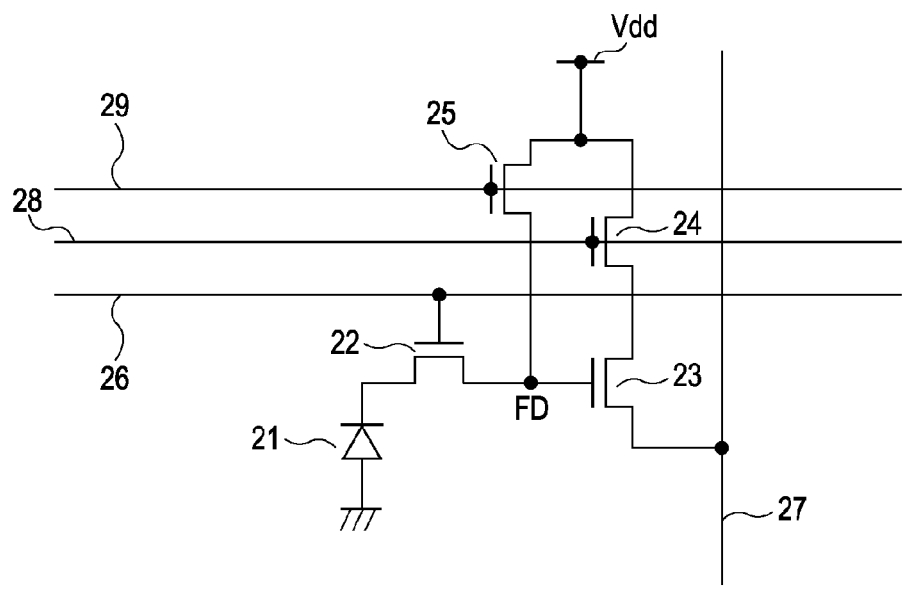
FIG. 3 is a circuit diagram showing a relevant portion of a pixel in an image-capturing region of the first embodiment.

FIG. 3 is a circuit diagram showing a relevant portion of a pixel in the image-capturing region of the first embodiment.

The pixel P formed in the image-capturing region PA includes a photodiode 21, a transfer transistor 22, an amplification transistor 23, a selection transistor 24, and a reset transistor 25, as shown in FIG. 3.

The photodiode 21 of the pixel P includes a grounded anode and a cathode coupled to the transfer transistor 22, as shown in FIG. 3.

In the pixel P, the transfer transistor 22 is provided between the photodiode 21 and the floating diffusion FD, as shown in FIG. 3. The gate electrode of the transfer transistor 22 is connected to a transfer line 26. When transfer pulses are fed from the transfer line 26 to the gate electrode, the transfer transistor 22 transfers the signal charges generated in the photodiode 21 to the floating diffusion FD.

The gate electrode of the amplification transistor 23 in the pixel P is connected to the floating diffusion FD, as shown in FIG. 3. The amplification transistor 23 is provided between the selection transistor 24 and a perpendicular signal line 27 described below.

The gate electrode of the selection transistor 24 of the pixel P is connected to an address line 28 through which address signals are fed, as shown in FIG. 3. The selection transistor 24 is provided between a power supply Vdd and the amplification transistor 23.

The gate electrode of the reset transistor 25 of the pixel P is connected to a reset line 29 through which reset signals are fed, as shown in FIG. 3. The reset transistor 25 is provided between the power supply Vdd and the floating diffusion FD.

The gate electrodes of the transfer transistors 22 of the pixels P in the same row are connected to each other, as are the gate electrodes of the selection transistors 24 and the gate electrodes of the reset transistor 25. Thus, as for the operation of the pixels P aligned in rows, pixels P in the same row are driven simultaneously.

(2-2) Peripheral Region

The peripheral region SA will now be described.

As shown in FIG. 2, the peripheral region SA is located in the periphery of the image-capturing region PA. Peripheral circuits for processing signal charges generated by the pixels P are provided in the peripheral region SA.

In particular, as shown in FIG. 2, a perpendicular selection circuit 13, a column circuit 14, a horizontal selection circuit 15, a horizontal signal line 16, an output circuit 17, and a timing control circuit 18 are provided as the peripheral circuits.

The perpendicular selection circuit 13 includes, for example, a shift register (not shown), and selects and drives the pixels P row by row.

The column circuit 14 includes, for example, a sample hold (S/H) circuit (not shown) and a correlated double sampling (CDS) circuit (not shown). The column circuit 14 performs signal processing on signals read out from the pixels P column by column.

The horizontal selection circuit 15 includes, for example, a shift register (not shown) and sequentially selects and outputs signals read out by the column circuit 14 from the pixels P. The horizontal selection circuit 15 performs the selection and the driving and sequentially outputs signals read out from the pixels P to the output circuit 17 via the horizontal signal line 16.

The output circuit 17 includes, for example, a digital amplifier. The output circuit 17 performs signal processing such as amplification on signals output from the horizontal selection circuit 15 and then outputs signals to an external device.

The timing control circuit 18 generates various timing signals and outputs the signals to the perpendicular selection circuit 13, the column circuit 14, and the horizontal selection circuit 15 to control driving of the respective units.

Figure 4:
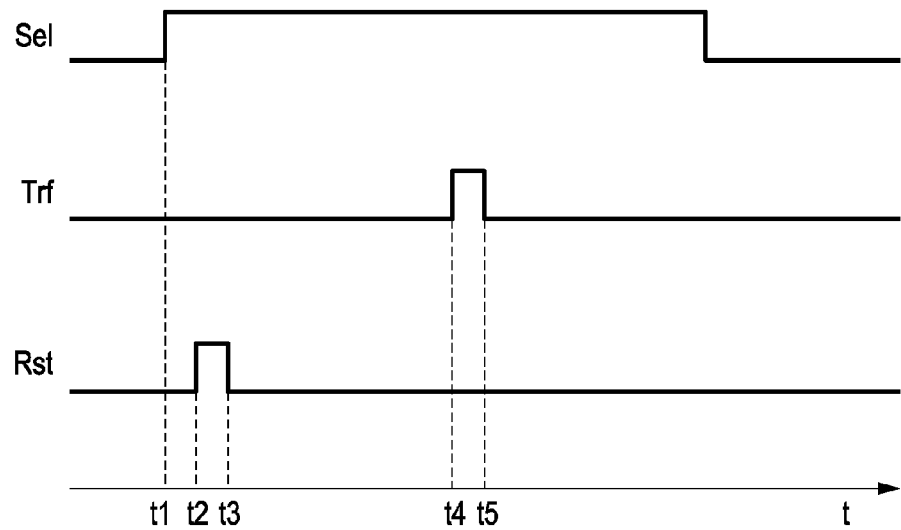
FIG. 4 is a timing chart indicating pulse signals fed to the respective units when signals are read from pixels P according to the first embodiment.

FIG. 4 is a timing chart indicating pulse signals fed to the respective units when signals are read from the pixels P according to the first embodiment. In FIG. 4, (a) indicates a selection signal, (b) indicates a transfer signal, and (c) indicates a reset signal.

As shown in FIG. 4, at a first timing t1, the selection transistor 24 is turned on. Next, at a second timing t2, the reset transistor 25 is turned on. This resets the gate potential of the amplification transistor 23.

Next, at a third timing t3, the reset transistor 25 is turned off. Subsequently, the voltage that corresponds to this reset level is read out to the column circuit 14.

At a fourth timing t4, the transfer transistor 22 is turned on to transfer the signal charges accumulated in the photodiode 21 to the gate of the amplification transistor 23.

Next, at a fifth timing t5, the transfer transistor 22 is turned off. Subsequently, the voltage of signal levels corresponding to the amount of accumulated signal charges is read out to the column circuit 14.

The column circuit 14 conducts subtraction processing on the reset levels read out first and the signal levels read out next and accumulates signals. As a result, fixed pattern noise generated by, for example, variation of Vth of the transistors of the respective pixels P is canceled.

Since the gates of the transistors 22, 24, and 25 are respectively connected by the rows of pixels aligned in the horizontal direction x, driving of the pixels is performed row by row, i.e., pixels of the same row are driven simultaneously. In particular, horizontal lines (pixel rows) are selected one after another in the direction perpendicular thereto in accordance with selection signals fed by the perpendicular selection circuit 13. The transistors of each pixel are controlled by various timing signals output from the timing control circuit 18. As a result, the output signals of the respective pixels are read out row by row to the column circuit 14 via the perpendicular signal line 27.

Then the signals accumulated in the column circuit 14 are selected by the horizontal selection circuit 15 and sequentially output to the output circuit 17.

(3) Detailed Structure of Solid-State Imaging Device

The details of the solid-state imaging device 1 of this embodiment will now be described.

Figure 5:
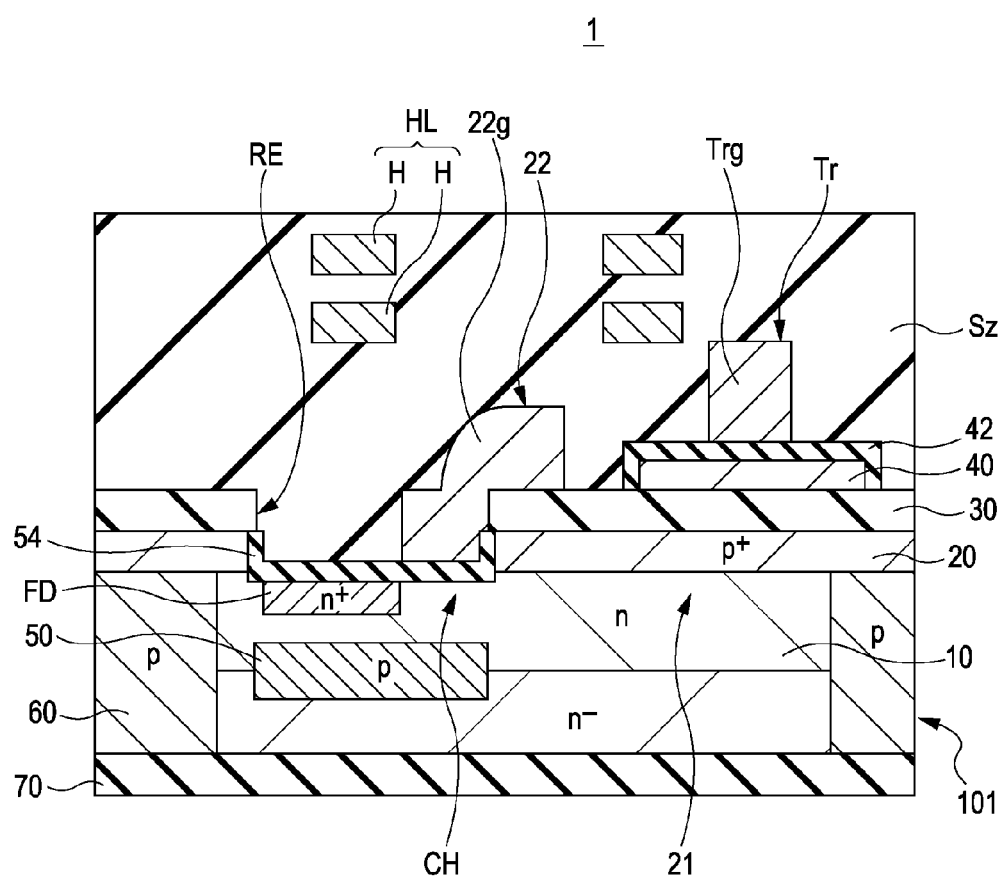
FIG. 5 is a cross-sectional view of the solid-state imaging device according to the first embodiment.

FIG. 5 is a cross-sectional view of the solid-state imaging device according to the first embodiment of the present invention.

The solid-state imaging device 1 of this embodiment is configured to receive the chief ray L entering from the rear side of the semiconductor substrate 101 to capture images.

In particular, as shown in FIG. 5, the solid-state imaging device 1 includes the semiconductor substrate 101 composed of an n-type silicon semiconductor. A buried oxide film 30 is disposed on the semiconductor substrate 101. A silicon film 40 is disposed on the buried oxide film 30. The semiconductor substrate 101 is provided with the photodiode 21, the transfer transistor 22, a pixel transistor Tr, and a photodiode isolating layer 60.

The pixel transistor Tr includes the amplification transistor 23, the selection transistor 24, and the reset transistor 25 shown in FIG. 3. The amplification transistor 23, the selection transistor 24, and the reset transistor 25 are collectively illustrated as a pixel transistor Tr throughout FIGS. 5 to 9.

The buried oxide film 30 is formed on the entire surface of the semiconductor substrate 101 except in a region where a trench RE described below is formed. The silicon film 40 is disposed on the buried oxide film 30 in a region where the pixel transistor Tr is formed.

(3-1) Photodiode

As shown in FIG. 5, the photodiode 21 is formed inside the semiconductor substrate 101. The photodiode 21 receives light from the rear side of the semiconductor substrate 101 and converts the light into electric charges to generate signal charges. The photodiode 21 includes an n-type semiconductor layer 10 and a p-type semiconductor layer 20. The p-type semiconductor layer 20 is formed at a position shallower than where the n-type semiconductor layer 10 is formed. As shown in FIG. 5, the n-type semiconductor layer 10 is in contact with the p-type semiconductor layer 20 to form a pn junction in the photodiode 21.

The n-type semiconductor layer 10 is formed by implanting ions of an n-type impurity into the semiconductor substrate 101 composed of an n-type silicon semiconductor. Accordingly, the concentration of the n-type impurity in the n-type semiconductor layer 10 is higher than the concentration of the n-type impurity in the semiconductor substrate 101. The concentration of the n-type impurity in the n-type semiconductor layer 10 is lower than the concentration of the n-type impurity in the floating diffusion FD described below. The concentration of the p-type impurity in the p-type semiconductor layer 20 is set higher than the concentration of the p-type impurity in a p-type semiconductor region 50 and the photodiode isolating layer 60 described below.

(3-2) Transistor

A surface of the silicon film 40 is oxidized by a thermal oxidation method, for example, to form a gate insulating film 42 composed of silicon oxide. A gate electrode Trg of the pixel transistor Tr, i.e., the amplification transistor 23, the selection transistor 24, and the reset transistor 25, is formed on the gate insulating film 42. Although not shown in the drawing, source/drain regions are formed in the silicon film 40 adjacent to the gate electrode Trg and form the pixel transistor Tr together with the gate electrode Trg and the gate insulating film 42.

(3-2-1) Transfer Transistor

As shown in FIG. 5, the transfer transistor 22 is formed in the surface of the semiconductor substrate 101. The transfer transistor 22 reads out the signal charges generated by the photodiode 21.

As shown in FIG. 5, a transfer gate electrode 22g of the transfer transistor 22 continuously extends from a part of the buried oxide film 30 on the photodiode 21 to a part of the trench RE (described below) adjacent to the photodiode 21. That is, the transfer gate electrode 22g continuously extends from above a channel-forming region CH with a gate insulating film 54 (described below) therebetween to a part of the p-type semiconductor layer 20 as it extends across the step. In other words, the transfer gate electrode 22g extends across the step between the gate insulating film 54 that lies in a portion where the buried oxide film 30 is removed near the floating diffusion FD and a portion of the buried oxide film 30 near the photodiode 21. The transfer gate electrode 22g is composed of a semiconductor in which an impurity of a particular conductivity type is diffused. For example, the transfer gate electrode 22g is composed of polysilicon.

Referring to FIG. 5, the floating diffusion FD is formed in the surface of the semiconductor substrate 101 under the trench RE so that the floating diffusion FD is diagonally adjacent to the transfer gate electrode 22g. The floating diffusion FD is formed by, for example, implanting an n-type impurity into the semiconductor substrate 101 so that the concentration of the n-type impurity in the floating diffusion FD is higher than the concentration of the n-type impurity in the n-type semiconductor layer 10. A region under the transfer gate electrode 22g and between the floating diffusion FD and the photodiode 21 is a channel-forming region CH where a channel is formed. The transfer transistor 22 reads out the signal charges accumulated in the n-type semiconductor layer 10 of the photodiode 21 to the floating diffusion FD via the channel. In other words, in this transfer transistor 22, the floating diffusion FD and the n-type semiconductor layer 10 of the photodiode 21 function as a pair of source and drain regions.

(3-2-2) Pixel Transistor

The pixel transistor Tr includes the amplification transistor 23, the selection transistor 24, and the reset transistor 25 shown in FIG. 3.

The pixel transistor Tr is formed on the buried oxide film 30. The gate electrode Trg of the pixel transistor Tr is formed on the gate insulating film 42 composed of silicon oxide on the surface of the silicon film 40. The source region (not shown) and the drain region (not shown) of the pixel transistor Tr are formed by, for example, implanting an n-type impurity into the silicon film 40.

The amplification transistor 23, the selection transistor 24, and the reset transistor 25 of the pixel transistor Tr are electrically connected to one another as shown in FIG. 3.

(3-3) Trench

The trench RE is formed in the semiconductor substrate 101 and is adjacent to the photodiode 21. For example, the trench RE is formed by etching the buried oxide film 30 and the p-type semiconductor layer 20 of the semiconductor substrate 101 so as to expose the n-type semiconductor layer 10 at the bottom of the trench RE. Preferably, the trench RE is deep enough to expose the surface of the n-type semiconductor layer 10. The inner surface of the trench RE in the semiconductor substrate 101 is oxidized by, for example, a thermal oxidation method and the gate insulating film 54 of the transfer transistor 22 composed of silicon oxide is formed on the surface of the semiconductor substrate 101 in the trench RE.

The transfer gate electrode 22g is formed extend from a part of the trench RE above the channel-forming region to above the p-type semiconductor layer 20.

(3-4) P-Type Semiconductor Region

A p-type semiconductor region 50 is located under the trench RE and in the semiconductor substrate 101 and faces the floating diffusion FD with a gap therebetween. The p-type semiconductor region 50 is located at a position deeper than the p-type semiconductor layer 20, for example. The p-type semiconductor region 50 is formed to have a length equal to the width of the trench RE, i.e., the sum of the length of the channel-forming region CH and the length of the floating diffusion FD in a cross-sectional view of FIG. 5.

If the p-type semiconductor region 50 is not provided, the charge accumulation layer of the photodiode 21 and the floating diffusion FD having the same conductivity type are in continuity irrespective of whether the transfer transistor 22 is turned ON or OFF. Then, it becomes difficult to control transfer of signal charges. When the p-type semiconductor region 50 is formed, a potential barrier is created between the charge accumulation layer and the floating diffusion FD and thus the path of signal charges (channel-forming region CH) can be narrowed. Accordingly, when the p-type semiconductor region 50 is formed, the transfer of the signal charges can be controlled by switching the transfer transistor 22 ON and OFF.

Alternatively, the p-type semiconductor region 50 may be longer than the width of the trench RE and may be in contact with the photodiode isolating layer 60 described below.

(3-5) Photodiode Isolating Layer

As shown in FIG. 5, the photodiode isolating layer 60 for isolating the n-type semiconductor layer 10 is formed in the semiconductor substrate 101. For example, the photodiode isolating layer 60 is formed by implanting ions of a p-type impurity.

As shown in FIG. 5, a wiring layer HL is formed at the front face side of the semiconductor substrate 101. The wiring layer HL includes a plurality of wirings H embedded in an interlayer insulating film Sz. The wirings respectively function as the transfer line 26, the perpendicular signal line 27, the address line 28, the reset line 29, etc., shown in FIG. 3.

As shown in FIG. 5, a protective film 70 is formed at the rear side of the semiconductor substrate 101. The protective film 70 is composed of hafnium oxide, silicon nitride, etc., and protects the rear surface of the semiconductor substrate 101.

In addition, optical components such as an on-chip lens (not shown), a color filter (not shown), etc., that are associated with the pixels P are formed on the semiconductor substrate 101. For example, when the imaging device is of a back-illuminated type in which light is incident on the rear side of the semiconductor substrate 101, optical components such as an on-chip lens, a color filter, etc., are provided on the rear side of the semiconductor substrate 101.

[B] Production Method

A method for making the solid-state imaging device 1 will now be described.

FIGS. 6A to 8C are cross-sectional views showing a relevant part in the respective steps of the method for making the solid-state imaging device of the first embodiment.

(1) Formation of Photodiode

First, referring to FIG. 6A, the p-type semiconductor layer 20 is formed as follows.

Prior to forming the photodiode 21, a semiconductor substrate 101 on which a buried oxide film 30 and a silicon film 40 are sequentially layered thereon is prepared. For example, a silicon-on-insulator (SOI) substrate may be used or a substrate prepared by layering a buried oxide film 30 and a silicon film 40 on a semiconductor substrate 101 may be used.

Figure 6A:
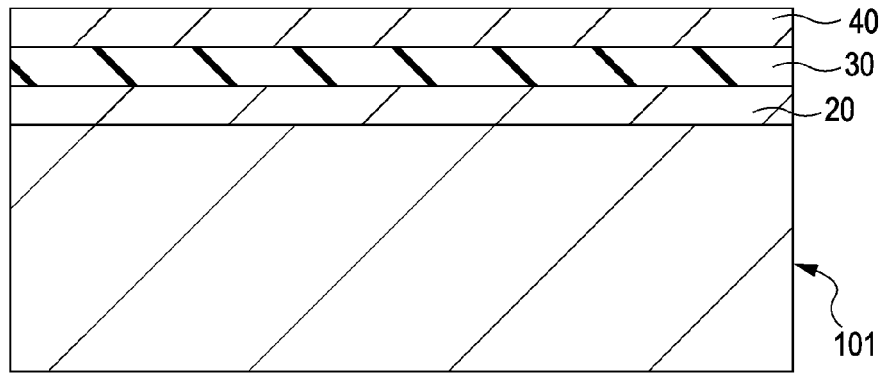

Referring to FIG. 6A, a p-type semiconductor layer 20, i.e., a $p^+$ layer, is formed in the surface of the semiconductor substrate 101 by implanting ions of a p-type impurity into the semiconductor substrate 101. The p-type semiconductor layer 20 is at least formed in portions where the photodiode 21, the channel-forming region CH, and the floating diffusion FD are to be formed.

To be more specific, in implanting the ions of the p-type impurity through the buried oxide film 30 and the silicon film 40, the energy of ion implantation is selected so that the p-type semiconductor layer 20 is formed near the surface of the semiconductor substrate 101. For example, the ions of the p-type impurity are implanted into the semiconductor substrate 101 under the following conditions:

Implanted ions: boron (B)
Implantation energy: about 50 keV
Impurity concentration: about $1 \times 10^{13}/cm^2$ When ions of the p-type impurity are implanted into the semiconductor substrate 101 under the above-mentioned conditions, the p-type semiconductor layer 20 is formed. The p-type impurity concentration in the p-type semiconductor layer 20 becomes higher than that in the p-type semiconductor region 50 and the photodiode isolating layer 60.

Figure 6B:
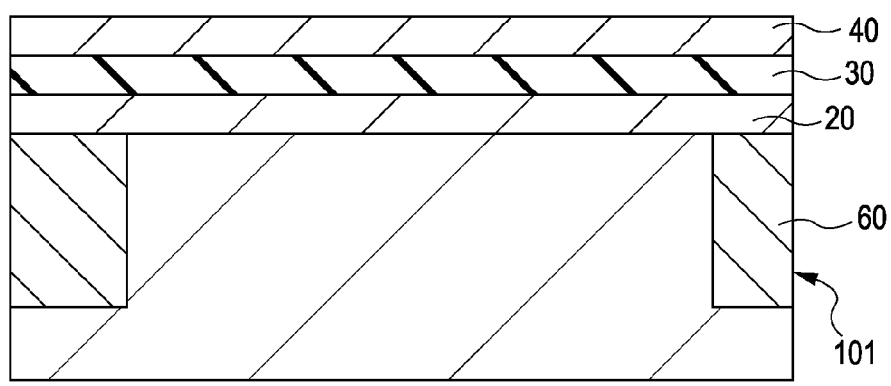

Next, as shown in FIG. 6B, the photodiode isolating layer 60 is formed in the semiconductor substrate 101 by implanting ions of a p-type impurity into the semiconductor substrate 101.

In particular, the ions of the p-type impurity are implanted in seven divided stages through the buried oxide film 30 and the silicon film 40 into portions of the semiconductor substrate 101 where the photodiode isolating layer 60 is to be formed. The implantation of the p-type impurity is conducted under following conditions while varying the implantation energy:

Implanted ions: boron (B)
Implantation energy: about 100 keV to about 3 MeV
Impurity concentration: about $2 \times 10^{12}/cm^2$ The photodiode isolating layer 60 is formed down to a depth of about 4 μm from the substrate surface.

When ions of the p-type impurity are implanted into the semiconductor substrate 101 under the above-mentioned conditions, the photodiode isolating layer 60 is formed.

Figure 6C:
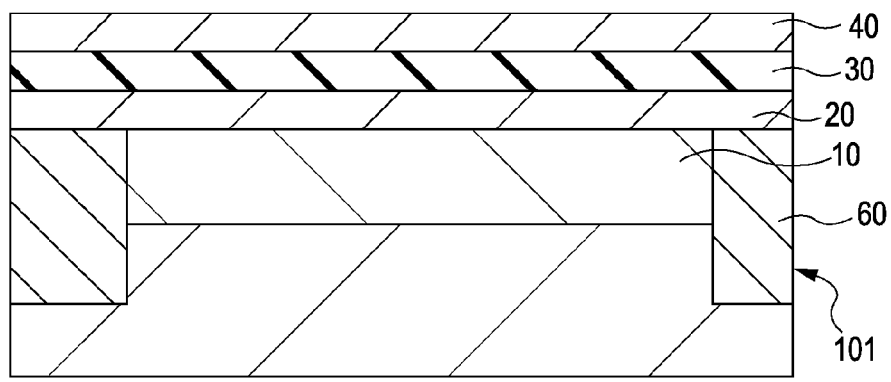

Next, referring to FIG. 6C, the n-type semiconductor layer 10 is formed by implanting ions of an n-type impurity into the semiconductor substrate 101. The n-type semiconductor layer 10 is formed under the p-type semiconductor layer 20 and in a region where the photodiode isolating layer 60 is not formed. The n-type semiconductor layer 10 is at least formed in portions where the photodiode 21, the channel-forming region CH, and the floating diffusion FD are to be formed.

To be more specific, the energy of ion implantation is selected so that the n-type semiconductor layer 10 is in contact with the rear side of the p-type semiconductor layer 20 and ions of the n-type impurity are implanted into the semiconductor substrate 101 through the buried oxide film 30 and the silicon film 40. For example, the ions of the n-type impurity are implanted into the semiconductor substrate 101 under the following conditions:

Implanted ions: arsenic (As)
Implantation energy: about 400 keV
Impurity concentration: about $4 \times 10^{12}/cm^2$ When ions of the n-type impurity are implanted into the semiconductor substrate 101 under the above-mentioned conditions, the n-type semiconductor layer 10 is formed.

In order to expand the n-type semiconductor layer 10 in the rear side direction, implantation of the n-type impurity ions into the semiconductor substrate 101 may be performed plural times.

(2) Formation of Transistors

Next, the transfer transistor 22 and the pixel transistor Tr shown in FIG. 5 are formed.

Figure 7A:
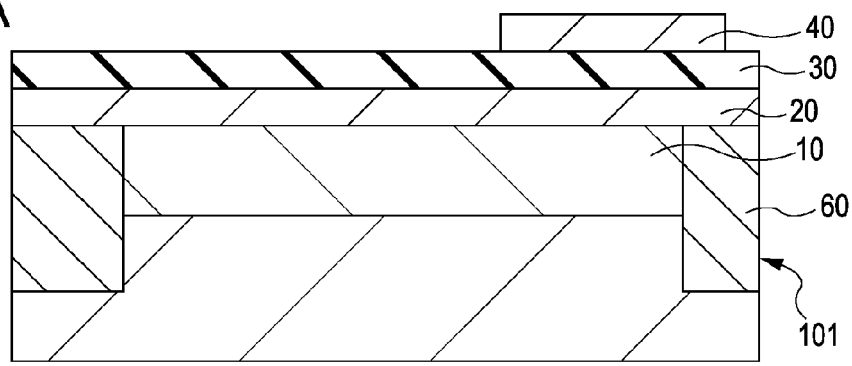

First, as described below with reference to FIG. 7A, the silicon film 40 is removed except for the portion where the pixel transistor Tr is to be formed.

That is, a mask (not shown) is formed on the silicon film 40 in the portion where the pixel transistor Tr is to be formed. Then as shown in FIG. 7A, the silicon film 40 is etched using the mask (not shown) to remove the silicon film 40 that lies in portions other than where the pixel transistor Tr is to be formed. Subsequently, the mask (not shown) is removed.

Figure 7B:
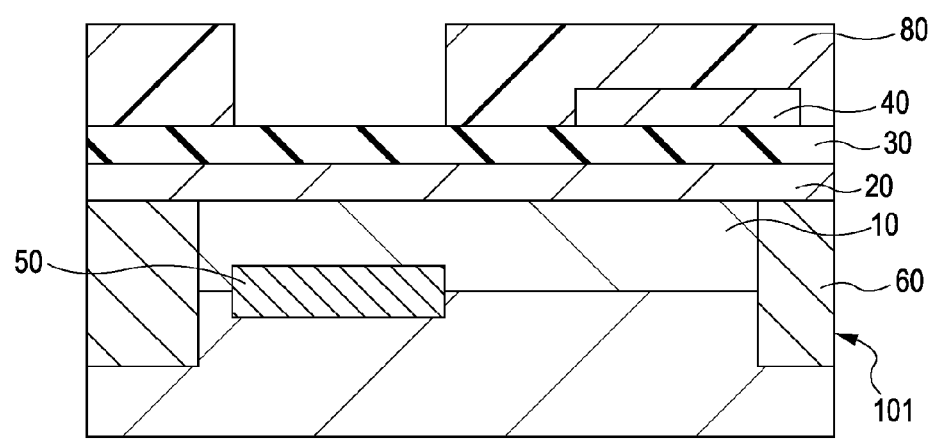

Next, as described below with reference to FIG. 7B, the p-type semiconductor region 50 is formed.

That is, a resist pattern 80 having an opening is formed on the buried oxide film 30 and the silicon film 40 so that the opening comes at a portion where the p-type semiconductor region 50 is to be formed. In other words, the resist pattern 80 is formed which has an opening at the portion where the channel-forming region CH and the floating diffusion FD are to be formed. For example, the resist pattern 80 is formed by exposing a pattern image onto a photoresist film (not shown) disposed on the semiconductor substrate 101 using an exposure device and developing the pattern image. Then the ions of a p-type impurity are implanted in the direction of the arrows in FIG. 7B while using the resist pattern 80 as a mask to form the p-type semiconductor region 50 in the semiconductor substrate 101.

In particular, the energy of ion implantation is selected so that the p-type semiconductor region 50 is located at a position deeper than the p-type semiconductor layer 20 in the semiconductor substrate 101. For example, the ions of the p-type impurity are implanted into the semiconductor substrate 101 under the following conditions:

Implanted ions: boron (B)
Implantation energy: about 70 keV
Impurity concentration: about $4 \times 10^{12}/cm^2$ When the ions of the p-type impurity are implanted under the aforementioned conditions by using the resist pattern 80 as a mask, the p-type semiconductor region 50 is formed in the semiconductor substrate 101 in a portion where the channel-forming region CH and the floating diffusion FD are to be formed. Moreover, when the ions of the p-type impurity are implanted under the aforementioned conditions, the p-type impurity concentration in the p-type semiconductor region 50 becomes lower than that in the p-type semiconductor layer 20 and about the same as that in the photodiode isolating layer 60.

Alternatively, the p-type semiconductor region 50 may be formed to be in contact with or overlap the photodiode isolating layer 60. In such a case, an opening extending over the photodiode isolating layer 60 is formed in the resist pattern 80 and the p-type semiconductor region 50 is formed by using this resist pattern 80 as a mask.

Next, as described below with reference to FIG. 7C, the trench RE is formed.

Figure 7C:
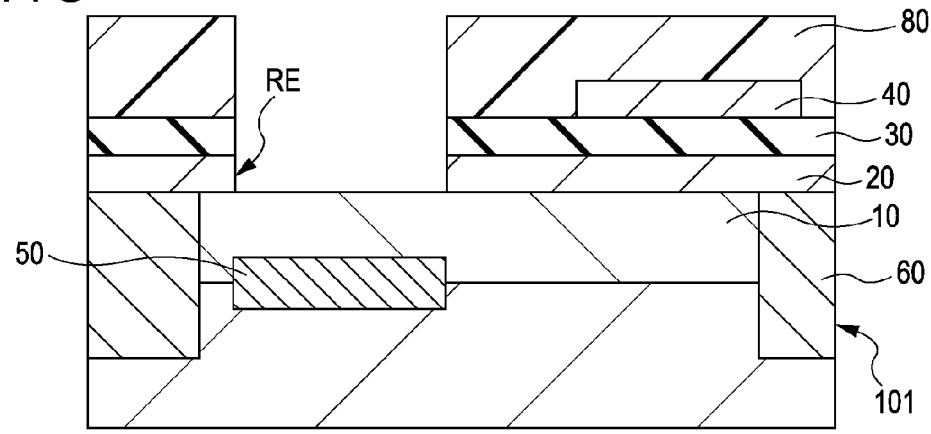

That is, referring to FIG. 7C, the same resist pattern 80 used to form the p-type semiconductor region 50 is used as the mask and the buried oxide film 30 and the p-type semiconductor layer 20 are etched to form the trench RE. Since the resist pattern 80 is used as a mask, the trench RE is formed in a portion where the channel-forming region CH and the floating diffusion FD are to be formed. For example, the etching is conducted until the n-type semiconductor layer 10 is exposed at the bottom of the trench RE.

To be more specific, the buried oxide film 30 is etched away by using the resist pattern 80 as a mask. For example, the buried oxide film 30 is etched under the following conditions:
Type of etching: dry etching
Gas used: $CF_4$ Next, etching conditions are changed and the p-type semiconductor layer 20 in the semiconductor substrate 101 is etched by using the resist pattern 80 as a mask to remove the p-type semiconductor layer 20 down to, for example, the PN junction, i.e., the surface of the n-type semiconductor layer 10. For example, the p-type semiconductor layer 20 is etched under the following conditions:
Type of etching: dry etching
Gas used: $CF_4+O_2$ Subsequently, the resist pattern 80 is removed. As a result, the p-type semiconductor region 50 is formed in a self-aligning manner with respect to the trench RE.

Alternatively, after the buried oxide film 30 is etched using the resist pattern 80 as a mask, the resist pattern 80 may be removed and the p-type semiconductor layer 20 may be removed using the buried oxide film 30 as a mask down to the surface of the n-type semiconductor layer 10.

Figure 8A:
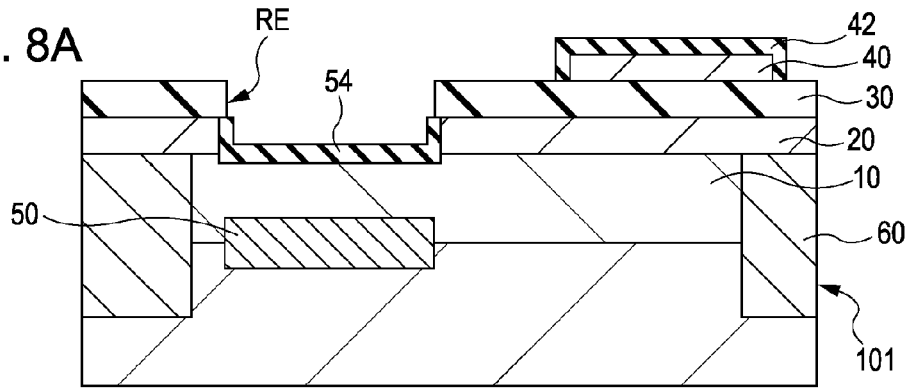

Next, as described below with reference to FIG. 8A, the gate insulating films are formed.

That is, the surface of the silicon film 40 is oxidized by, for example, a thermal process to form a gate insulating film 42 composed of silicon oxide. The surface from which the p-type semiconductor layer 20 is removed, i.e., the surface of the semiconductor substrate 101 exposed in the trench RE, is oxidized by, for example, a thermal process to form the gate insulating film 54 composed of silicon oxide.

Figure 8B:
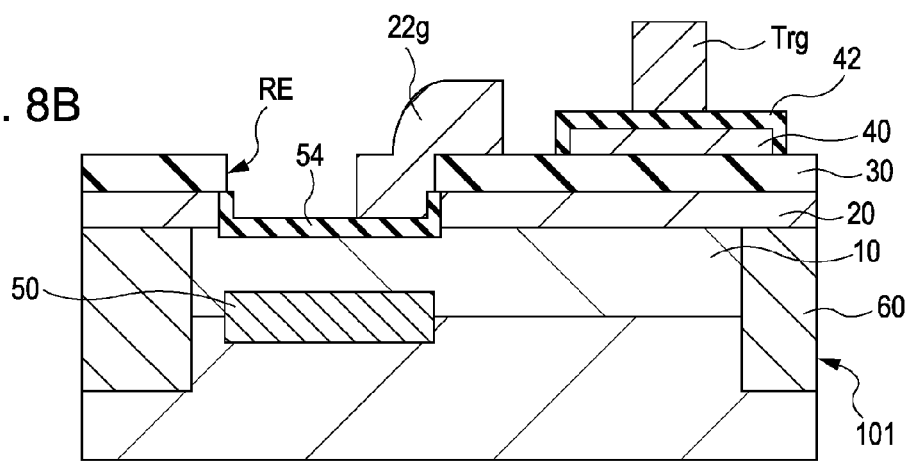

Next, as described below with reference to FIG. 8B, gate electrodes, namely, the transfer gate electrode 22g and the gate electrode Trg, are formed.

That is, the transfer gate electrode 22g is formed to extend from above the channel-forming region CH with the gate insulating film 54 in the trench RE therebetween to a part of the upper surface of the buried oxide film 30 above the photodiode 21. Here, the transfer gate electrode 22g is formed not to contact the gate insulating film 42. The gate electrode Trg is formed on the gate insulating film 42 at the same time as forming the transfer gate electrode 22g.

For example, the transfer gate electrode 22g and the gate electrode Trg are formed by patterning by forming a polysilicon film on the buried oxide film 30, the gate insulating film 42, and the gate insulating film 54 and dry-etching the polysilicon film using, as a mask, a photoresist (not shown) that has a pattern corresponding to gate electrode-forming regions.

Next, as described below with reference to FIG. 8C, the floating diffusion FD is formed.

Figure 8C:
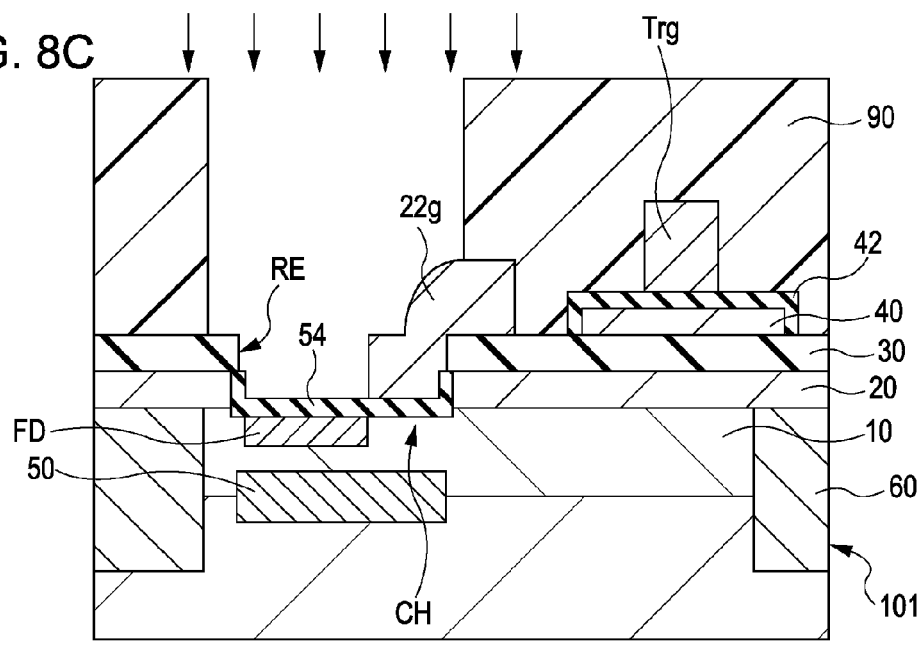

That is, ions of an n-type impurity are implanted into the semiconductor substrate 101 in the direction of arrows in FIG. 8C to form the floating diffusion FD on the surface of the semiconductor substrate 101 where the p-type semiconductor layer 20 is removed, i.e., where the trench RE is formed.

To be more specific, as shown in FIG. 8C, the ions of the n-type impurity are implanted into the semiconductor substrate 101 by using a resist pattern 90, the transfer gate electrode 22g, and the buried oxide film 30 as the mask. As a result, the floating diffusion FD is formed in a surface region of the semiconductor substrate 101 diagonally adjacent to the transfer gate electrode 22g in a self-aligning manner with respect to the transfer gate electrode 22g. Simultaneously with formation of the floating diffusion FD, the n-type impurity ions are also implanted into the silicon film 40 at both sides of the gate electrode Trg so as to form the source region and the drain region of the pixel transistor Tr. For example, the ions of the n-type impurity are implanted into the semiconductor substrate 101 under the following conditions:
Implanted ions: phosphorus (P)
Implantation energy: about 10 keV
Implantation dose: about $2\times10^{15}$ atom/cm$^2$ When ions of the n-type impurity are implanted into the semiconductor substrate 101 under the above-mentioned conditions, for example, the floating diffusion FD is formed. Moreover, when ions of the n-type impurity are implanted under the above-mentioned conditions, the n-type impurity concentration in the floating diffusion FD becomes higher than that in the n-type semiconductor layer 10. The floating diffusion FD and the photodiode 21 respectively function as the source region and the drain region of the transfer transistor 22. As a result, the transfer transistor 22 and the pixel transistor Tr are obtained. Subsequently, the resist pattern 90 is removed.

Next, as shown in FIG. 9A, the wiring layer HL and the interlayer insulating film Sz are formed on the transistors.

Referring to FIG. 9B, a supporting substrate (not shown) is bonded onto a front side of the semiconductor substrate 101 where the transistors are formed. The rear surface of the semiconductor substrate 101 is polished by, for example, chemical mechanical polishing (CMP) to decrease the thickness of the semiconductor substrate 101.

Then a hafnium oxide film or a silicon nitride film is formed on the polished surface of the semiconductor substrate 101 to form the protective film 70 for protecting the rear surface of the semiconductor substrate 101. As a result, the solid-state imaging device 1 shown in FIG. 5 is obtained.

[C] Summary

As described above, in this embodiment, the transfer gate electrode 22g is adjacent to the p-type semiconductor layer 20 with the gate insulating film 54 therebetween. Thus, adverse effects caused by misalignment does not occur. The photoelectron accumulating unit of the photodiode 21 is a portion of the n-type semiconductor layer 10 that lies under the p-type semiconductor layer 20. The positional relationship between the transfer gate electrode 22g and the photoelectron accumulating unit is also not affected by the misalignment. In the channel region, since the end of the p-type semiconductor layer 20 and the end of the p-type semiconductor region 50 are both defined by the trench RE, the channel region is also not affected by the misalignment. Thus, according to the production method of this embodiment, a solid-state imaging device 1 in which signal charges can be satisfactorily transferred from the photodiode 21 to the floating diffusion FD can be provided.

As a result, a solid-state imaging device 1 having a high saturation signal level, high sensitivity, and low random noise can be manufactured. When the solid-state imaging device 1 is used, an electronic apparatus that has a high saturation signal level, high sensitivity, and low random noise can be manufactured.

The photoelectron accumulating unit of the photodiode 21 is close to the transfer gate electrode 22g in both the depth direction and the transverse direction with the gate insulating film 54 therebetween. Accordingly, the efficiency of transferring the signal charges accumulated in the charge accumulation layer of the photodiode 21 to the floating diffusion FD can be improved and the voltage can be lowered.

In this embodiment, light is received by the rear surface of the semiconductor substrate 101. However, other arrangements are also possible. The same advantages can be obtained even when the chief ray L is received by the front surface of the semiconductor substrate 101 where the pixel transistor and other associated components are formed.

2. Second Embodiment

[A] Device Configuration

Figure 10:
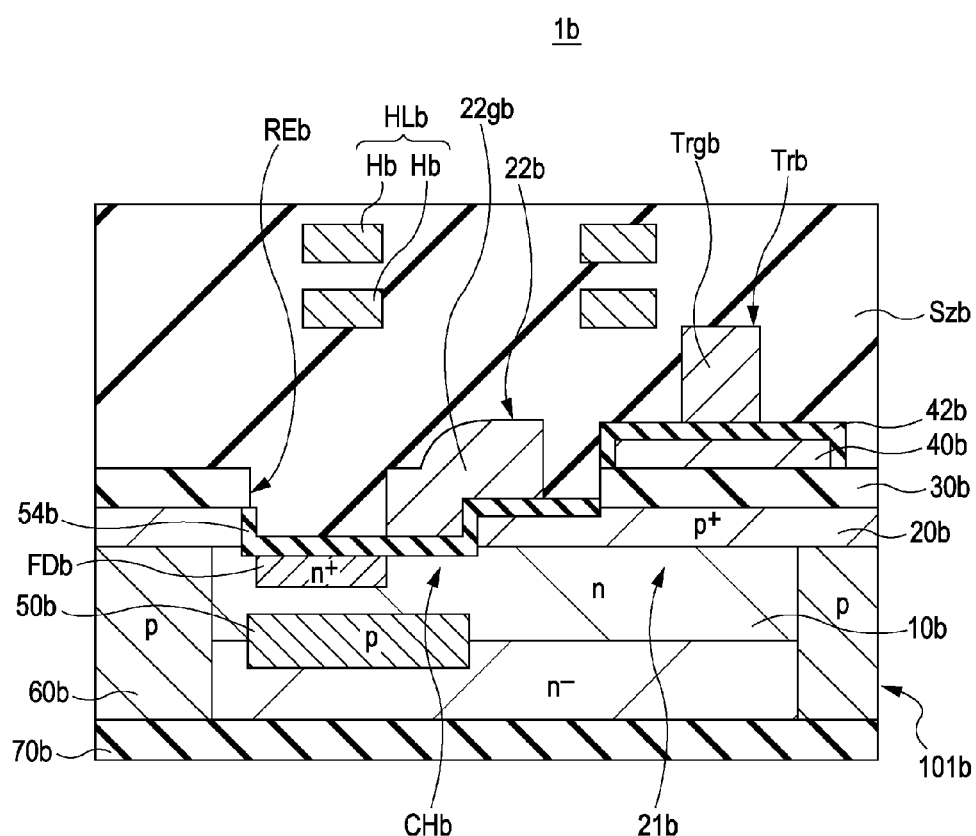
FIG. 10 is a cross-sectional view of a solid-state imaging device according to a second embodiment.

FIG. 10 is a cross-sectional view of a solid-state imaging device according to a second embodiment of the present invention.

As shown in FIG. 10, a solid-state imaging device 1b of this embodiment differs from the first embodiment in the arrangement of the transfer gate electrode (transfer gate electrode 22gb). The second embodiment is the same as the first embodiment in other features. Thus, the description is simplified to avoid redundancy.

As shown in FIG. 10, the transfer gate electrode 22gb is formed on a gate insulating film 54b and continuously extends from a part of a trench REb to the upper surface of a p-type semiconductor layer 20b of a photodiode 21b. In other words, the transfer gate electrode 22gb continuously extends from above a channel-forming region CHb to above the p-type semiconductor layer 20b with the gate insulating film 54b therebetween. The solid-state imaging device 1b has the same configuration as the first embodiment except for this.

In this embodiment, the transfer gate electrode 22gb is not formed on a buried oxide film 30b but on the gate insulating film 54b above the p-type semiconductor layer 20b. As a result, the step across which the transfer gate electrode 22gb extends becomes lower than that in the first embodiment. Thus, the gate etching margin is increased and the production can be simplified since the gate material remaining in the step portion can be easily removed.

[B] Production Method

A method for making the solid-state imaging device 1b will now be described.

Figure 11A:
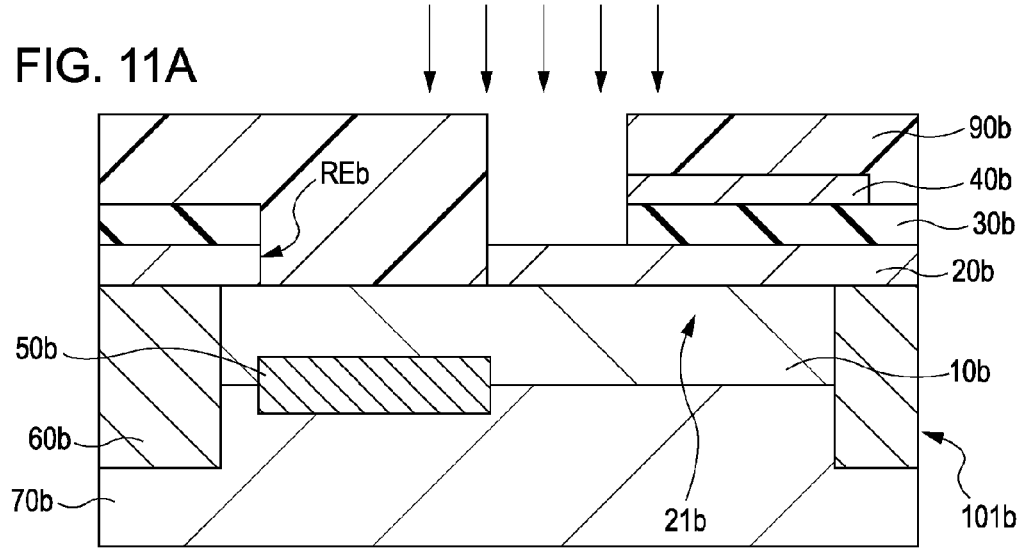
FIGS. 11A to 11C are cross-sectional views showing a relevant part in the respective steps of a method for making the solid-state imaging device of the second embodiment.
Figure 11B:
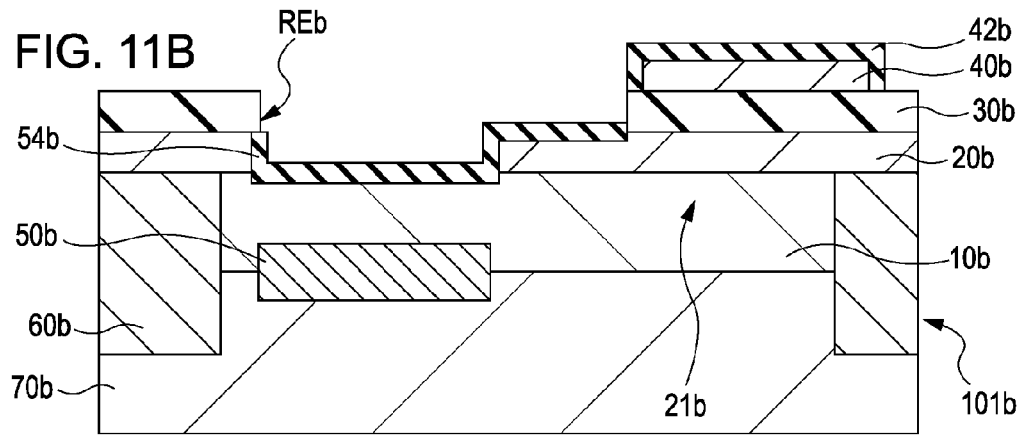
Figure 11C:
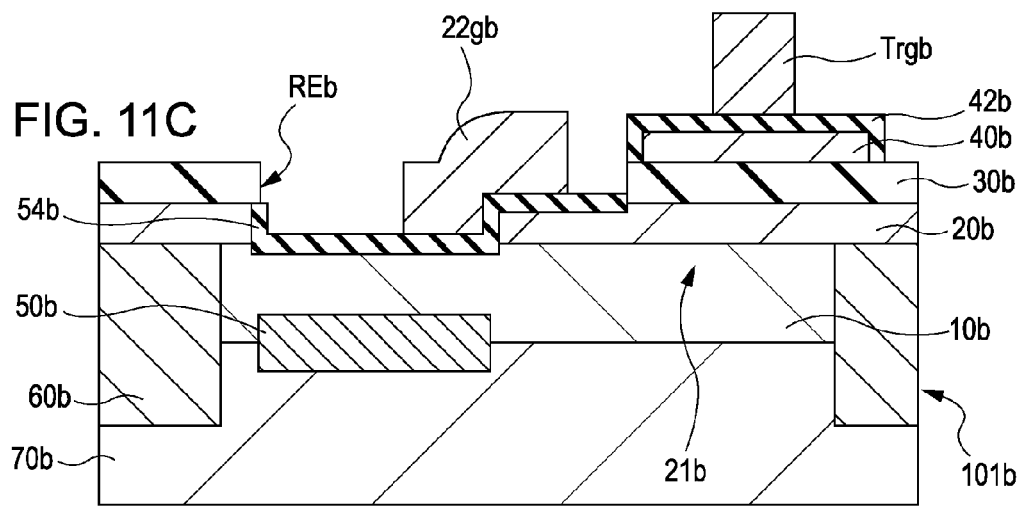

FIGS. 11A to 11C are cross-sectional views showing a relevant part in the respective steps of the method for making the solid-state imaging device of the second embodiment.

The steps up to the step of forming the trench RE are the same as the first embodiment and thus are not described.

As described below with reference to FIG. 11A, the buried oxide film 30b is removed. Here, the buried oxide film 30b in the region where the transfer gate electrode 22gb is to be formed is at least removed.

That is, first, as shown in FIG. 11A, a resist pattern 90b having an opening having a shape of the portion from which the buried oxide film 30b is to be removed is formed so that the opening comes at that portion. For example, the resist pattern 90b is formed by exposing a pattern image onto a photoresist film (not shown) disposed on a semiconductor substrate 101b using an exposure device and developing the pattern image.

Then as shown in FIG. 11A, the buried oxide film 30b is etched using the resist pattern 90b as a mask to remove a particular part of the buried oxide film 30b. Subsequently, the resist pattern 90b is removed. As a result, the trench REb is formed.

Next, with reference to FIG. 11B, gate insulating films, namely, a gate insulating film 42b and a gate insulating film 54b, are formed as in the first embodiment.

Then, as described below with reference to FIG. 11C, gate electrodes, namely, a transfer gate electrode 22gb and a gate electrode Trgb of a pixel transistor Trb, are formed.

That is, the transfer gate electrode 22gb is formed on the gate insulating film 54b to extend from above the channel-forming region CHb to above the p-type semiconductor layer 20b of a photodiode 21b while avoiding contact with the gate insulating film 42b. The gate electrode Trgb is formed in the gate electrode-forming region on the gate insulating film 42b as the same time as forming the transfer gate electrode 22gb. The process of forming the transfer gate electrode 22gb and the gate electrode Trgb are the same as the first embodiment.

Subsequently, a floating diffusion FDb, a wiring layer Hzb, an interlayer insulating film Szb, and a protective film 70b are formed as in the first embodiment to end fabrication of the solid-state imaging device 1b shown in FIG. 10.

[C] Summary

In this embodiment, all components are formed as in the first embodiment except for the transfer gate electrode 22gb.

Thus, as in the first embodiment, a solid-state imaging device 1b capable of satisfactorily transferring signal charges from the photodiode 21b to the floating diffusion FDb can be produced. As a result, a solid-state imaging device 1b having a high saturation signal level, high sensitivity, and low random noise can be manufactured. When the solid-state imaging device 1b is used, an electronic apparatus that has a high saturation signal level, high sensitivity, and low random noise can be manufactured.

Moreover, since the transfer gate electrode 22gb is formed on the p-type semiconductor layer 20b and not on the buried oxide film 30b, the step across which the transfer gate electrode 22gb extends becomes lower than that in the first embodiment. Thus, the gate etching margin is increased and the production can be simplified since the gate material remaining in the step portion can be easily removed.

3. Third Embodiment

[A] Device Configuration

Figure 12:
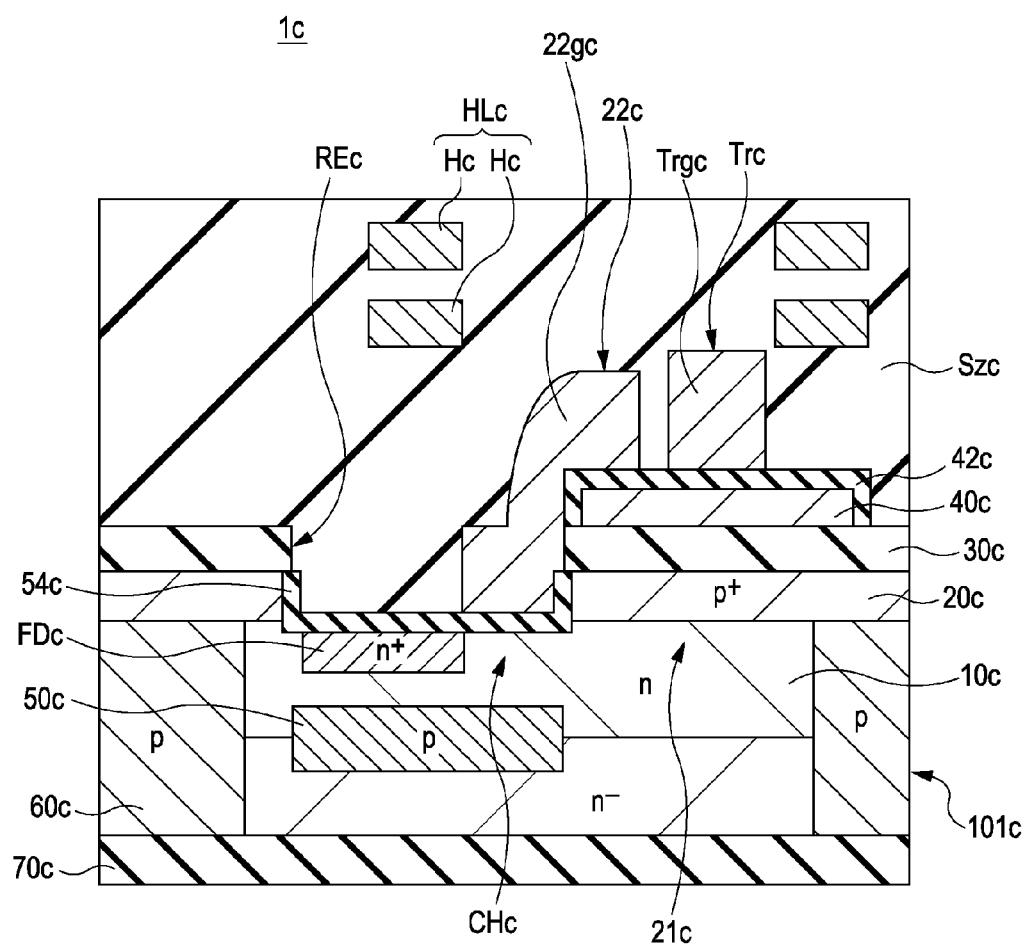
FIG. 12 is a cross-sectional view of a solid-state imaging device according to a third embodiment of the present invention.

FIG. 12 is a cross-sectional view of a solid-state imaging device according to a third embodiment of the present invention.

As shown in FIG. 12, a solid-state imaging device 1c of this embodiment differs from the first embodiment in the arrangement of the transfer gate electrode (transfer gate electrode 22gc). The third embodiment is the same as the first embodiment in other features. Thus, the description is simplified to avoid redundancy.

As shown in FIG. 12, the transfer gate electrode 22gc continuously extends from a part of a gate insulating film 54c above a channel-forming region CHc to a part of a gate insulating film 42c on a silicon film 40c above a photodiode 21c. The solid-state imaging device 1c has the same configuration as the first embodiment except for this.

In this embodiment, the transfer gate electrode 22gc is formed not on the a buried oxide film 30c but on the gate insulating film 42c. The size of the solid-state imaging device 1c of this embodiment can thus be further reduced compared to the solid-state imaging device 1 of the first embodiment.

[B] Production Method

A method for making the solid-state imaging device 1c will now be described.

FIGS. 13A to 14B are cross-sectional views showing a relevant part in the respective steps of the method for making the solid-state imaging device of the third embodiment.

The steps up to the step of forming a pixel transistor Trc are the same as the first embodiment and thus are not described.

Next, as described below with reference to FIG. 13A, a p-type semiconductor region 50c is formed That is, a resist pattern 80c with an opening having a shape of a portion where the p-type semiconductor region 50c is to be formed is formed so that the opening is arranged to come at that portion. In other words, the resist pattern 80c is formed to expose the portion where the channel-forming region CHc and a floating diffusion FDc are to be formed. Furthermore, the resist pattern 80c is formed so that the opening-side side surface of the silicon film 40c forms the side wall of the opening of the resist pattern 80c. The process of forming the resist pattern 80c is the same as the first embodiment.

Figure 13A:
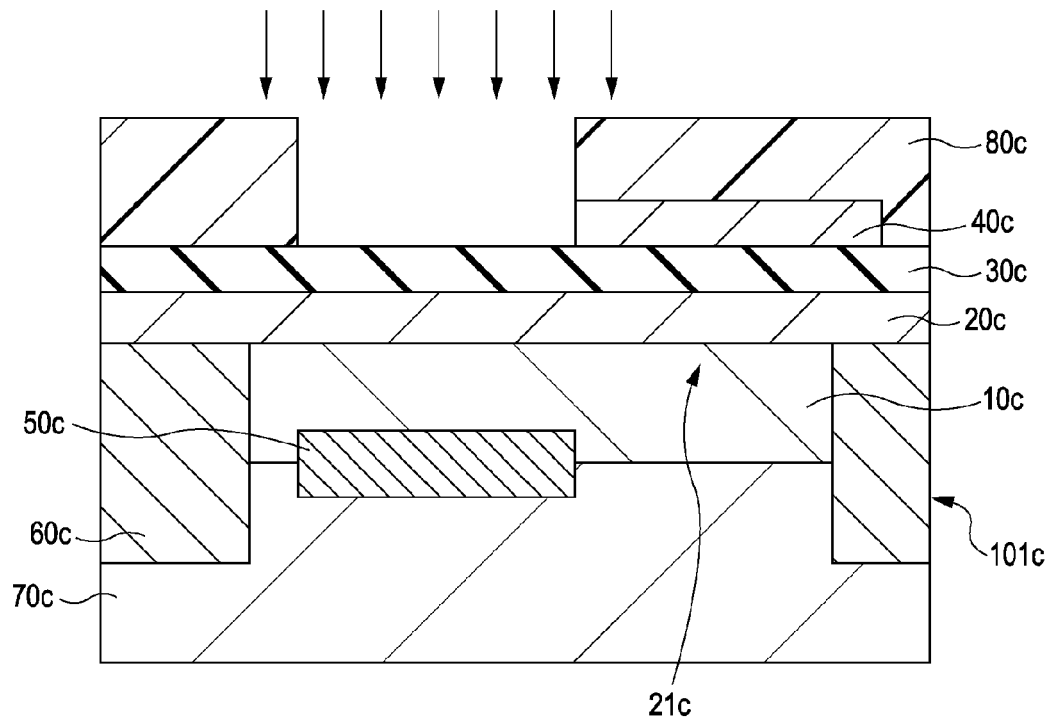
FIGS. 13A to 14B are cross-sectional views showing a relevant part in the respective steps of the method for making the solid-state imaging device of the third embodiment.

The ions of the p-type impurity are implanted in the direction of the arrows in FIG. 13A while using the resist pattern 80c as a mask to form the p-type semiconductor region 50c in a semiconductor substrate 101c. The process of the ion implantation is the same the first embodiment.

Figure 13B:
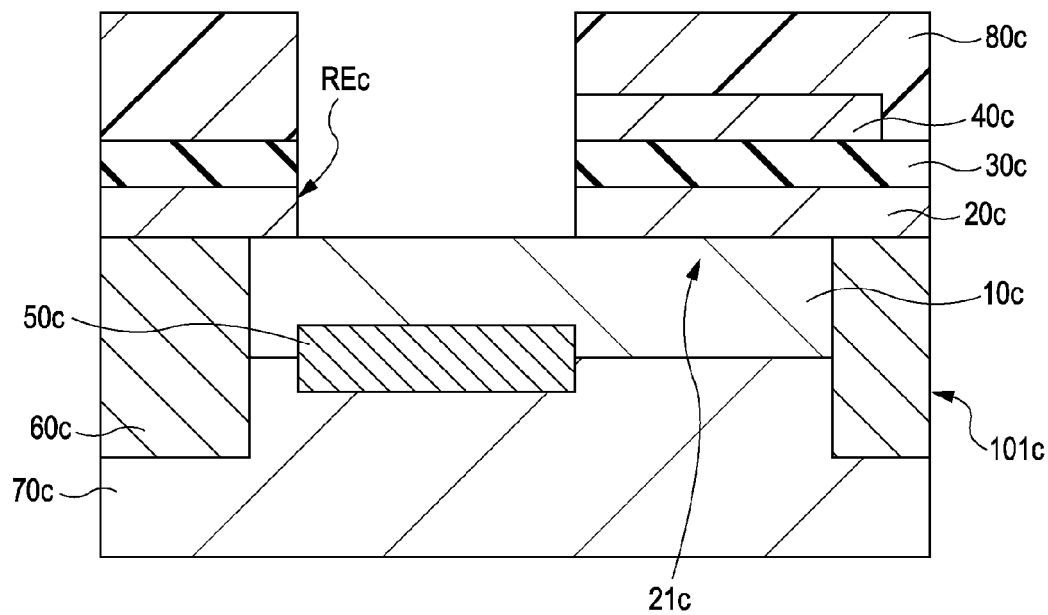

Next, as shown in FIG. 13B, a trench REc is formed by the same process as in the first embodiment. As a result, the p-type semiconductor region 50c is formed in a self-aligning manner with respect to the trench REc.

Figure 14A:
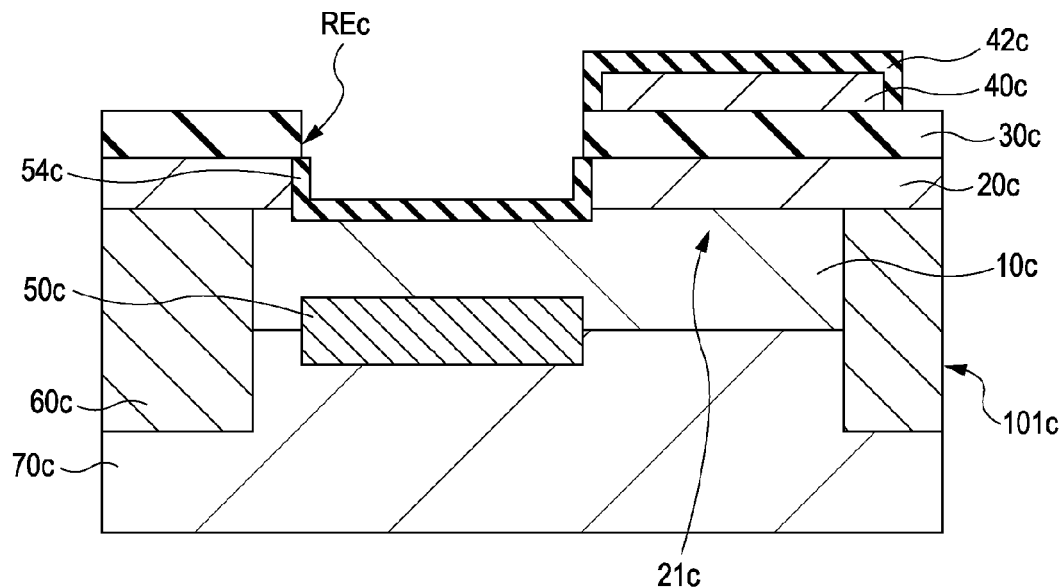

Next, as shown in FIG. 14A, gate insulating films, namely, a gate insulating film 42c and a gate insulating film 54c are formed by the same process as in the first embodiment.

Figure 14B:
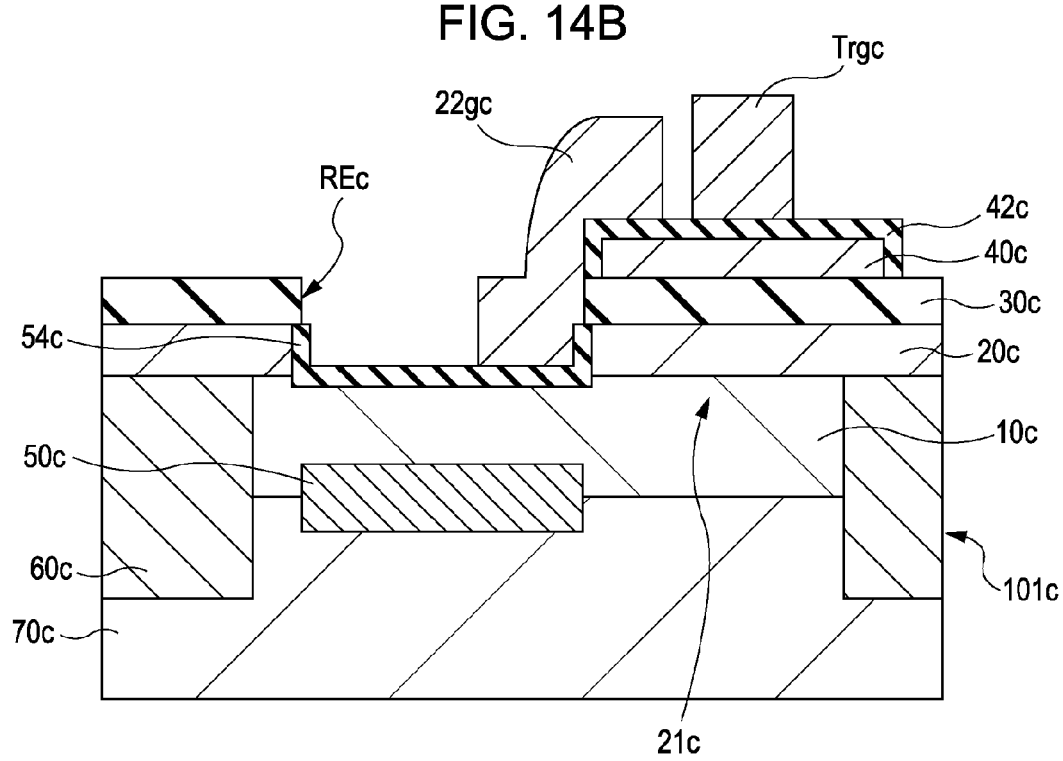

Next, as described below with reference to FIG. 14B, gate electrodes, namely, a transfer gate electrode 22gc and a gate electrode Trgc, are formed.

That is, the transfer gate electrode 22gc is formed to extend from a part of the gate insulating film 54c in the trench REc above the channel-forming region CHc to a part of the gate insulating film 42c on the upper surface of the silicon film 40c while avoiding contact with the gate electrode Trgc. The gate electrode Trgc is formed in the gate electrode-forming region on the gate insulating film 42c simultaneously with the transfer gate electrode 22gc. The process of forming the transfer gate electrode 22gc and the gate electrode Trgc are the same as the first embodiment.

Subsequently, a floating diffusion FDc, a wiring layer Hzc, an interlayer insulating film Szc, and a protective film 70c are formed as in the first embodiment to end fabrication of the solid-state imaging device 1c shown in FIG. 12.

[C] Summary

In this embodiment, all components are formed as in the first embodiment except for the transfer gate electrode 22gc.

Accordingly, as in the first embodiment, a solid-state imaging device 1c capable of satisfactorily transferring signal charges from the photodiode 21c to the floating diffusion FDc through the transfer gate electrode 22gc can be produced.

As a result, a solid-state imaging device 1c having a high saturation signal level, high sensitivity, and low random noise can be manufactured. When the solid-state imaging device 1c is used, an electronic apparatus that has a high saturation signal level, high sensitivity, and low random noise can be manufactured.

Since the transfer gate electrode 22gc is formed on the silicon film 40c, the area of the solid-state imaging device 1c can be reduced by the area of the portion exposing the buried oxide film 30 in the first embodiment. As a result, the size of the solid-state imaging device 1c can be reduced.

4. Fourth Embodiment

[A] Device Configuration

Figure 15:
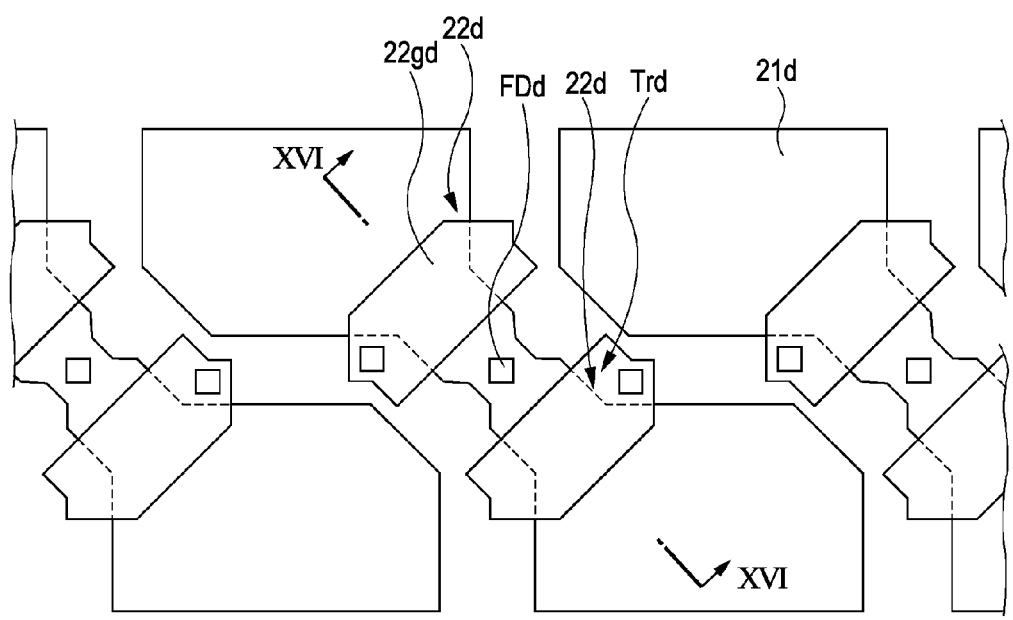
FIG. 15 is a diagram showing a relevant part of a solid-state imaging device according to a fourth embodiment of the present invention.
Figure 16:
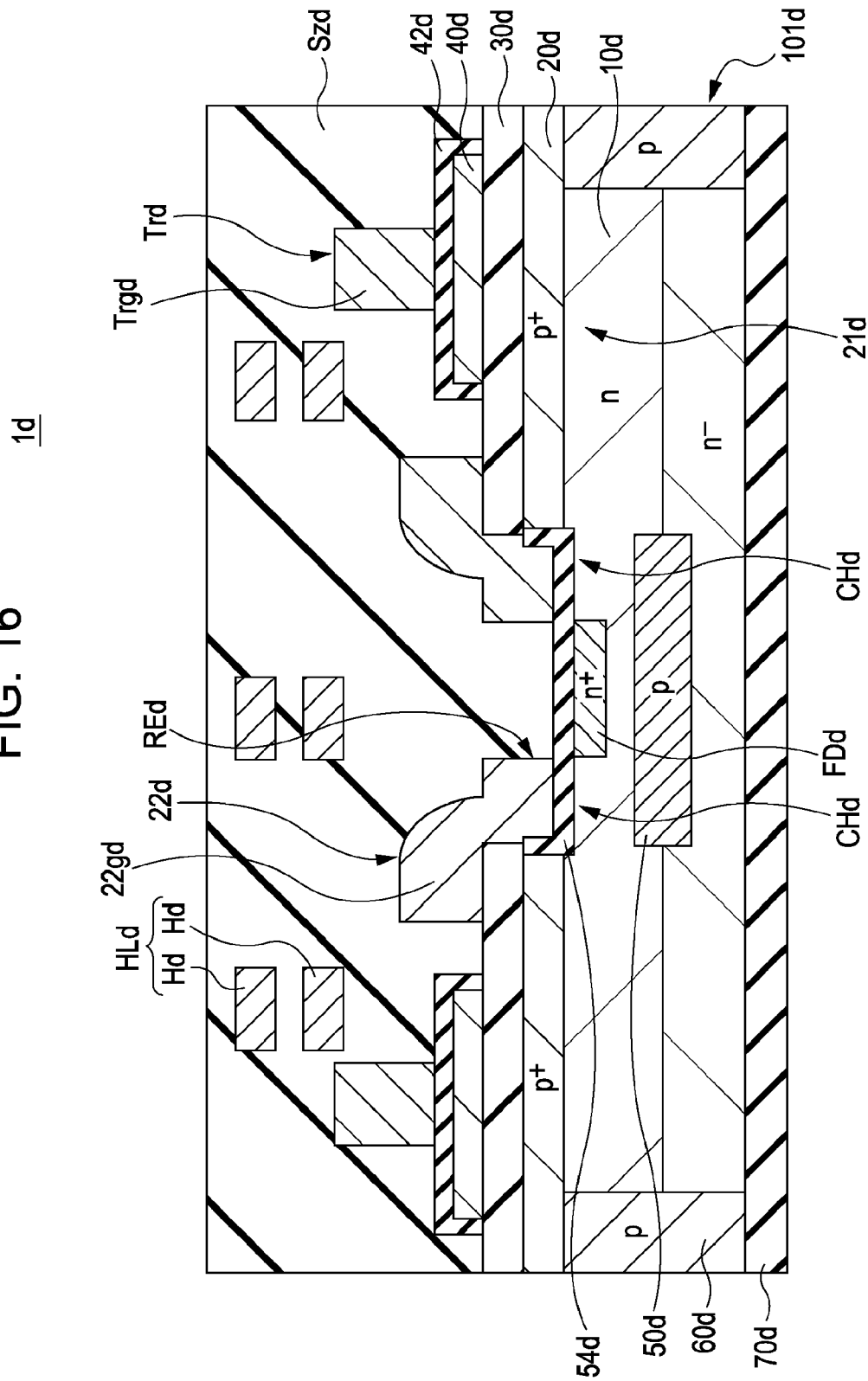
FIG. 16 is a cross-sectional view of the solid-state imaging device according to the fourth embodiment.
Figure 17:
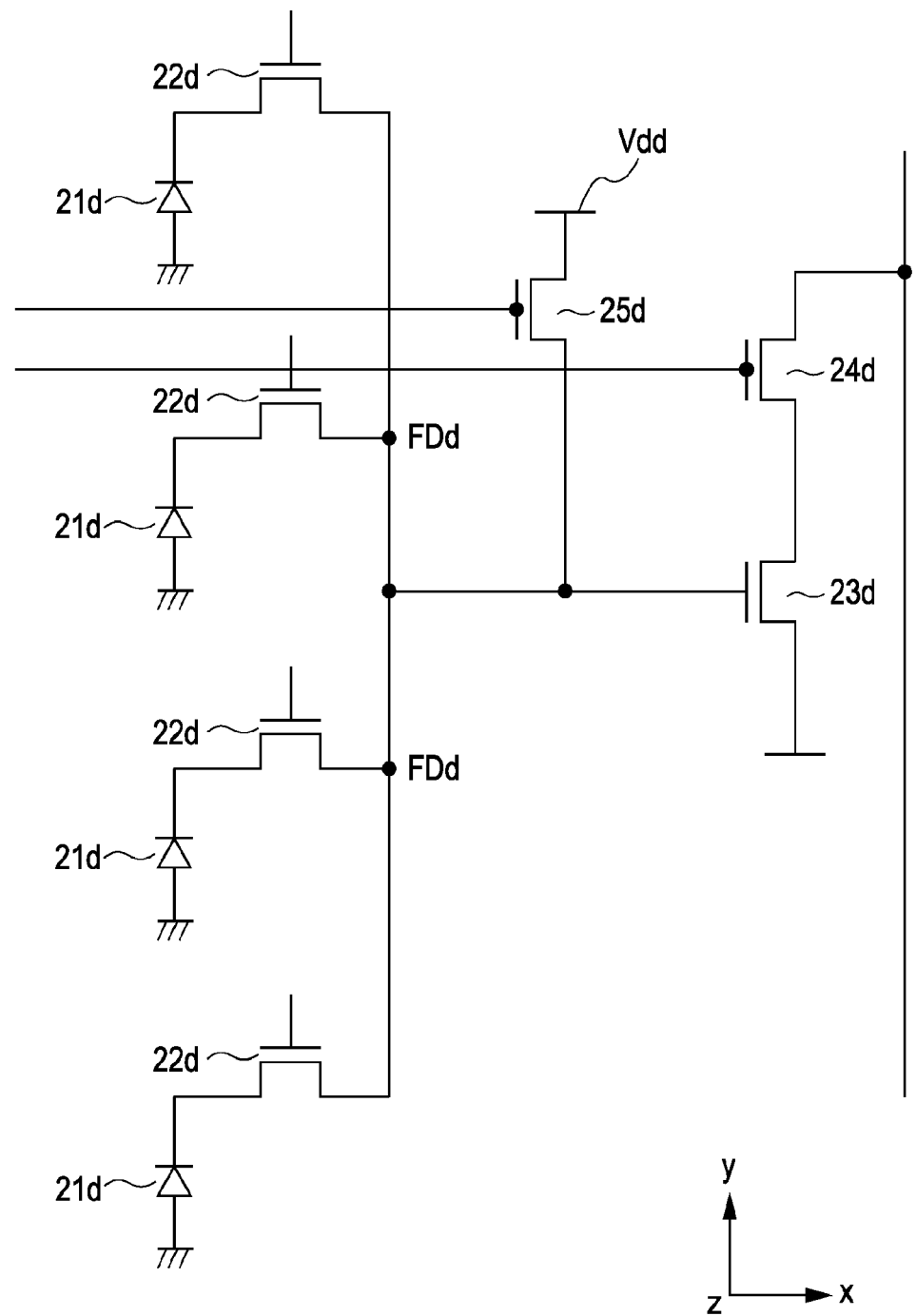
FIG. 17 is a circuit diagram showing a relevant part of pixels P provided in an image-capturing region of the fourth embodiment.

FIGS. 15 to 17 are diagrams illustrating a relevant part of a solid-state imaging device 1d according to a fourth embodiment of the present invention.

As shown in FIG. 16, the solid-state imaging device 1d of this embodiment differs from the first embodiment in the arrangement of photodiodes 21d and transfer electrodes 22gd. Otherwise, the fourth embodiment is the same as the first embodiment. Thus, the description is simplified to avoid redundancy.

FIG. 15 is a top view of an image-capturing region PA. FIG. 16 is a cross-sectional view of the image-capturing region PA taken along line XVI-XVI in FIG. 15. FIG. 17 illustrates a circuit configuration of pixels P provided in the image-capturing region PA.

Respective components of the solid-state imaging device 1d will now be described.

(1) Photodiodes

The solid-state imaging device 1d includes a plurality of photodiodes 21d arranged on a signal-readout surface (xy surface) in a manner identical to that shown in FIG. 2. The photodiodes 21d are aligned in the horizontal direction x and the perpendicular direction y orthogonal to the horizontal direction x at regular intervals so as to correspond to the arrangement of the pixels P.

In this embodiment, as shown in FIGS. 15 and 16, each photodiode 21d is provided with a transfer transistor 22d. The transfer transistor 22d is adjacent to the photodiode 21d. The photodiodes 21d are arranged so that a pair of photodiodes 21d sandwich one floating diffusion FDd. In this embodiment, two photodiodes 21d that are diagonally aligned with respect to both the horizontal direction x and the perpendicular direction y are arranged to sandwich one floating diffusion FDd.

As shown in FIG. 17, four photodiodes 21d are configured to share one set of an amplification transistor 23d, a selection transistor 24d, and a reset transistor 25d. Four transfer transistors 22d are formed for four photodiodes 21d. Two photodiodes 21d and two transfer transistors 22d are formed to share one floating diffusion FDd.

One amplification transistor 23d, one selection transistor 24d, and one reset transistor 25d are provided for four photodiodes 21d, as shown in FIG. 17.

(2) Transfer Transistors

As shown in FIG. 15, a plurality of transfer transistors 22d are formed to correspond the pixels P. The transfer transistors 22d are arranged such that a floating diffusion FDd disposed between pixels P diagonally aligned with respect to the horizontal direction x and the perpendicular direction y is sandwiched by two transfer transistors 22d.

As shown in FIG. 16, the transfer gate electrode 22gd of the transfer transistor 22d extends from a part of a gate insulating film 54d above a channel-forming region CHd to a part of a buried oxide film 30d on a photodiode 21d. The transfer gate electrode 22gd of the transfer transistor 22d is diagonally adjacent to the floating diffusion FDd in the surface of a semiconductor substrate 101d, as shown in FIG. 16. A pair of transfer gate electrodes 22gd sandwich one floating diffusion FDd.

In this embodiment, as shown in FIG. 17, one of the terminals of each transfer transistor 22d is electrically coupled to a cathode of the photodiode 21d and the other terminal is electrically coupled to the floating diffusion FDd. In particular, a pair of transfer transistors are electrically coupled to one floating diffusion FDd. Another pair of transfer transistors are electrically coupled to another floating diffusion FDd.

(3) Pixel Transistor

A pixel transistor Trd including an amplification transistor 23d, a selection transistor 24d, and a reset transistor 25d is provided between a plurality of photodiodes 21d aligned in the perpendicular direction y, as shown in FIG. 15.

In this embodiment, the amplification transistor 23d, the selection transistor 24d, and the reset transistor 25d are shared by a group of photodiodes 21d, as shown in FIG. 17. To be more specific, one amplification transistor 23d, one selection transistor 24d, and one reset transistor 25d are provided for every group of four photodiodes 21d, as shown in FIG. 17.

Thus, the size of the solid-state imaging device 1d of this embodiment can be further reduced compared to the solid-state imaging device 1 of the first embodiment.

[B] Production Method

A method for making the solid-state imaging device 1d will now be described.

Figure 18A:
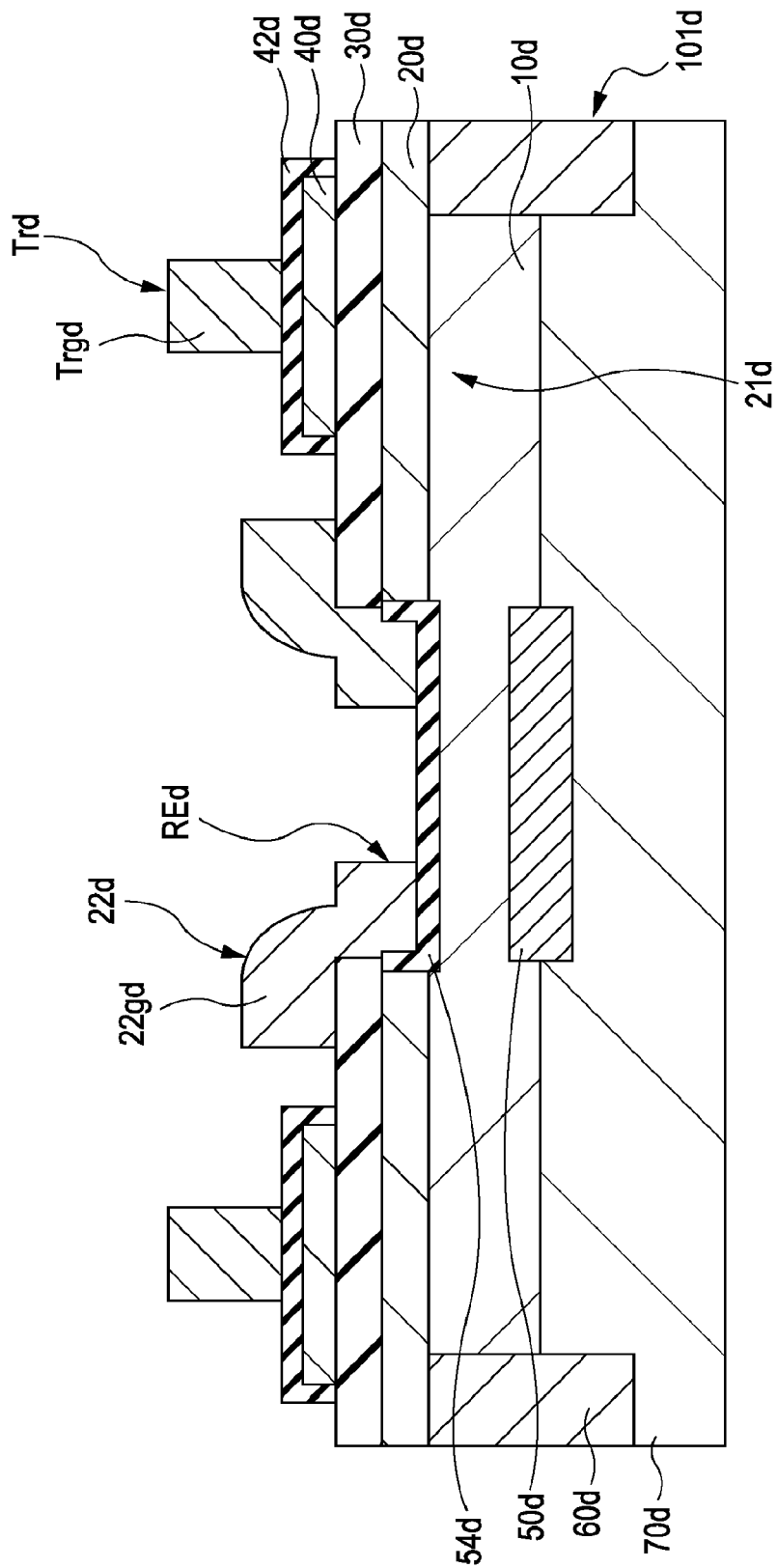

FIGS. 18A and 18B are cross-sectional views showing a relevant part in the respective steps of the method for making the solid-state imaging device of the fourth embodiment.

The steps up to the step of forming the gate insulating films are the same as the first embodiment and thus are not described.

As described below with reference to FIG. 18A, gate electrodes, namely, a transfer gate electrode 22gd and a gate electrode Trgd, are formed next.

That is, the transfer gate electrode 22gd is formed to extend from a part of a gate insulating film 54d in a trench REd above a channel-forming region CHd to a part of the upper surface of a buried oxide film 30d on the photodiode 21d. The gate electrode Trgd is formed in the gate electrode-forming region on the gate insulating film 42d simultaneously with the transfer gate electrode 22gd. The process of forming the transfer gate electrode 22gd and the gate electrode Trgd are the same as the first embodiment.

Next, as shown in FIG. 18B, a floating diffusion FDd is formed in the surface of a semiconductor substrate 101d by implanting ions of an n-type impurity in the direction of arrows in FIG. 18B into the semiconductor substrate 101d from which a p-type semiconductor layer 20d is removed.

To be more specific, as shown in FIG. 18B, the ions of the n-type impurity are implanted into the semiconductor substrate 101d by using a resist pattern 90d, the transfer gate electrode 22gd, and a buried oxide film 30d as a mask. As a result, the floating diffusion FDd is formed in the surface region of the semiconductor substrate 101d so as to be adjacent to each of the pair of the transfer gate electrodes 22gd. Simultaneously, the n-type impurity ions are also injected into a silicon film 40d at both sides of the gate electrode Trgd so as to form the source region and the drain region of the pixel transistor Trdg. The conditions of the ion implantation are the same as those in the first embodiment.

Subsequently, a wiring layer Hzd, an interlayer insulating film Szd, and a protective film 70d are formed as in the first embodiment to end fabrication of the solid-state imaging device 1d, as shown in FIGS. 18A and 18B.

[C] Summary

In this embodiment, all components are formed as in the first embodiment except for the number of the photodiodes 21d and the transfer gate electrode 22gd arranged.

Accordingly, as in the first embodiment, a solid-state imaging device 1d capable of satisfactorily transferring signal charges from the photodiode 21d to the floating diffusion FDd through the transfer gate electrode 22gd can be produced.

As a result, a solid-state imaging device 1d having a high saturation signal level, high sensitivity, and low random noise can be manufactured. When the solid-state imaging device 1d is used, an electronic apparatus that has a high saturation signal level, high sensitivity, and low random noise can be manufactured.

In this embodiment, four transfer transistors are provided for four photodiodes. One amplification transistor 23d, one selection transistor 24d, and one reset transistor 25d are provided for four photodiodes 21d. As a result, the size of the solid-state imaging device 1d can be reduced.

In implementing the present invention, various modifications and alterations of the above-embodiments may be employed. For example, the p-type semiconductor region may have a configuration other than those of the embodiments described above.

Figure 19:
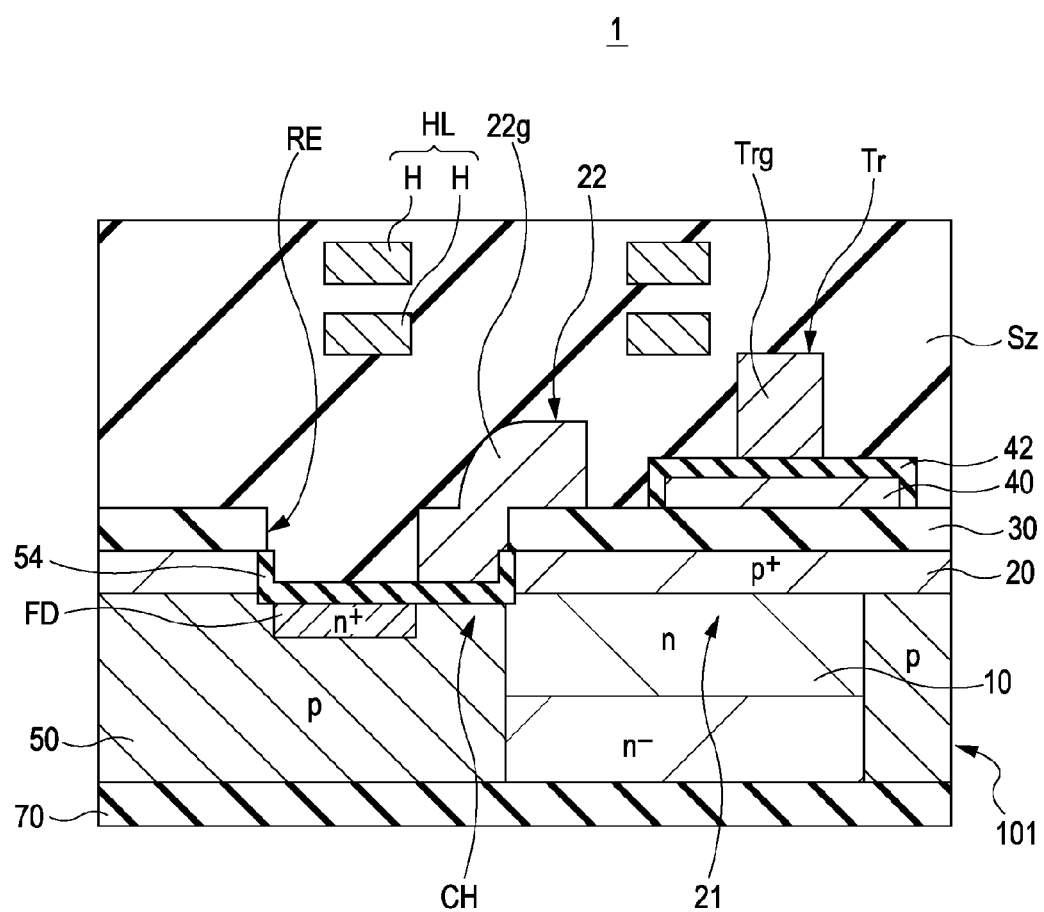
FIG. 19 is a cross-sectional view showing a modification of a solid-state imaging device.

FIG. 19 is a cross-sectional view showing a modification of a p-type semiconductor region 50. As shown in FIG. 19, the p-type semiconductor region 50 may be extended from under the trench RE in the depth direction.

According to this structure, when the transfer transistor 22 is turned off, the photodiode 21 and the floating diffusion FD are not in continuity. When the transfer transistor 22 is turned on, a channel is formed in the channel-forming region CH, and the photodiode 21 and the floating diffusion FD are in continuity.

Although solid-state imaging devices that receive the chief ray L at the rear side are described in these embodiments, the configuration is not limited to this. The same advantages can be achieved by solid-state imaging devices that receive the chief ray L at the front side.

It should be noted that, in the embodiments described above, the semiconductor substrates 101, 101b, 101c, and 101d are non-limiting examples of the semiconductor substrate according to the present invention. The n-type semiconductor layer 10 is a non-limiting example of the second region of the present invention. The p-type semiconductor layer 20 is a non-limiting example of the first region according to the present invention. The photodiodes 21, 21b, 21c, and 21d are non-limiting examples of the photoelectric conversion unit according to the present invention. The transfer transistors 22, 22b, 22c, and 22d are non-limiting examples of the transfer transistor according to the present invention. The transfer gate electrodes 22g, 22gb, 22gc, and 22gd are non-limiting examples of the transfer gate electrode according to the present invention. The pixel transistors Tr, Trb, Trc, and Trd are non-limiting examples of the transistor according to the present invention. The resist patterns 80 and 80c are non-limiting examples of the resist pattern according to the present invention. The p-type semiconductor regions 50 and 50c are non-limiting examples of the third region according to the present invention. The buried oxide films 30 and 30d are non-limiting examples of the insulating film according to the present invention. The silicon films 40, 40c, and 40d are non-limiting examples of the semiconductor layer according to the present invention. The gate insulating films 54, 54b, 54c, and 54d are non-limiting examples of the semiconductor layer according to the present invention. The channel-forming regions CH, CHb, CHc, and CHd are non-limiting examples of the channel region according to the present invention. The floating diffusion FD, FDb, FDc, and FDd are non-limiting examples of the readout drain according to the present invention.

The present application contains subject matter related to that disclosed in Japanese Priority Patent Application JP 2009-191133 filed in the Japan Patent Office on Aug. 20, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for making a solid-state imaging device including a semiconductor substrate having a signal-readout surface in which a photoelectric conversion unit and a transfer transistor are formed, the photoelectric conversion unit including a first region and a second region that form a pn junction therebetween, the transfer transistor being configured to transfer signal charges from the photoelectric conversion unit to a readout drain via a channel region, the method comprising the steps of:

forming the first region in the semiconductor substrate by implanting ions of an impurity of a first conductivity type into a portion of the signal-readout surface where the photoelectric conversion unit, the channel region, and the readout drain are to be formed;

forming the second region in the semiconductor substrate by implanting an impurity of a second conductivity type into a portion of the signal-readout surface where the photoelectric conversion unit, the channel region, and the readout drain are to be formed, the portion being located at a position deeper than the first region;

forming a resist pattern over the signal-readout surface, the resist pattern having an opening that leaves a portion of the signal-readout surface uncovered where the channel region and the readout drain are to be formed;

forming a third region in the semiconductor substrate by implanting an impurity of the first conductivity type into a portion of the signal-readout surface where the channel region and the readout drain are to be formed, the portion being located at a position deeper than the first region, while using the resist pattern as a mask;

removing a portion of the first region that lies above the third region by etching;

forming a gate insulating film of the transfer transistor on a portion of the signal-readout surface of the semiconductor substrate from which the first region has been removed;

forming a transfer gate electrode that extends from above the channel region with the gate insulating film therebetween to above the first region; and forming the readout drain by implanting ions of an impurity of the second conductivity type into a portion of the signal-readout surface of the semiconductor substrate from which the first region has been removed, while using the transfer gate electrode as a mask.

2. The method according to claim 1, wherein, in forming the third region, the third region is formed at a position deeper than the second region.

3. The method according to claim 1, wherein, in forming the first region, the ions of the impurity of the first conductivity type are implanted through an insulating film formed on the signal-readout surface of the semiconductor substrate, in forming the second region, the impurity of the second conductivity type is implanted through the insulating film, in forming the resist pattern, the resist pattern is formed above the insulating film, and prior to removing the portion of the first region, the resist pattern is used as a mask to etch away the insulating film that lies above the portion of the signal-readout surface of the semiconductor substrate where the channel region and the readout drain are to be formed.

4. The method according to claim 3, wherein, in forming the first region, the ions of the impurity of the first conductivity type are implanted into the signal-readout surface of the semiconductor substrate through the insulating film and a semiconductor layer formed above the insulating film, and in forming the second region, the impurity of the second conductivity type is implanted through the insulating film and the semiconductor layer.

5. The method according to claim 4, further comprising a step of:

forming a transistor in the signal-readout surface using the semiconductor layer, the transistor being configured to output data signals corresponding to signal charges transferred to the readout drain, to a signal line, wherein, in forming the transistor, the semiconductor layer is patterned after the second region has been formed so that the semiconductor layer has a pattern corresponding to the transistor;

in forming the gate insulating film of the transfer transistor, a gate insulating film of the transistor is formed on the semiconductor layer, and in forming the transfer gate electrode, a conductive film is formed to cover the signal-readout surface in a portion where the transfer gate electrode and the gate electrode of the transistor are to be formed, and, subsequently, the conductive film is patterned to form the transfer gate electrode and a gate electrode of the transistor.

6. The method according to claim 5, wherein, in forming the transfer gate electrode, the transfer gate electrode is formed to extend from above the channel region to above the insulating film with the gate insulating film of the transistor therebetween.

* * * * *